(12) United States Patent
Murthy et al.

(10) Patent No.: US 11,908,934 B2
(45) Date of Patent: Feb. 20, 2024

(54) SEMICONDUCTOR DEVICE HAVING DOPED EPITAXIAL REGION AND ITS METHODS OF FABRICATION

(71) Applicant: Intel Corporation, Santa Clara, CA (US)

(72) Inventors: Anand S. Murthy, Portland, OR (US); Daniel Bourne Aubertine, North Plains, OR (US); Tahir Ghani, Portland, OR (US); Abhijit Jayant Pethe, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 411 days.

(21) Appl. No.: 17/161,534

(22) Filed: Jan. 28, 2021

(65) Prior Publication Data

US 2021/0159339 A1    May 27, 2021

Related U.S. Application Data

(60) Continuation of application No. 14/059,398, filed on Oct. 21, 2013, now Pat. No. 10,957,796, which is a
(Continued)

(51) Int. Cl.
*H01L 29/78* (2006.01)
*H01L 21/02* (2006.01)
(Continued)

(52) U.S. Cl.
CPC ...... *H01L 29/7834* (2013.01); *H01L 21/0243* (2013.01); *H01L 21/02057* (2013.01);
(Continued)

(58) Field of Classification Search
CPC .................. H01L 29/7834; H01L 29/78; H01L 29/66477; H01L 29/165; H01L 29/66636;
(Continued)

(56) References Cited

U.S. PATENT DOCUMENTS 6,214,679 B1 * 4/2001 Murthy ............. H01L 29/66636
257/E29.085
7,138,320 B2   11/2006 Van Bentum
(Continued)

FOREIGN PATENT DOCUMENTS

CN    101208786    6/2008
CN    101622690    1/2010
(Continued)

OTHER PUBLICATIONS

Office Action from European Patent Application No. 17164305.9, dated May 5, 2022, 10 pages.
(Continued)

*Primary Examiner* — Sonya McCall-Shepard
(74) *Attorney, Agent, or Firm* — Schwabe, Williamson & Wyatt, P.C.

(57) ABSTRACT

Embodiments of the present invention describe a epitaxial region on a semiconductor device. In one embodiment, the epitaxial region is deposited onto a substrate via cyclical deposition-etch process. Cavities created underneath the spacer during the cyclical deposition-etch process are back-filled by an epitaxial cap layer. The epitaxial region and epitaxial cap layer improves electron mobility at the channel region, reduces short channel effects and decreases parasitic resistance.

8 Claims, 20 Drawing Sheets

Related U.S. Application Data division of application No. 12/643,912, filed on Dec. 21, 2009, now Pat. No. 8,598,003.

(51) Int. Cl.

| | |
|---|---|
| *H01L 29/08* | (2006.01) |
| *H01L 29/165* | (2006.01) |
| *H01L 29/66* | (2006.01) |
| *H01L 21/28* | (2006.01) |
| *H01L 29/49* | (2006.01) |
| *H01L 29/423* | (2006.01) |

(52) U.S. Cl.
CPC .... *H01L 21/0262* (2013.01); *H01L 21/02381* (2013.01); *H01L 21/02529* (2013.01); *H01L 21/02532* (2013.01); *H01L 21/02576* (2013.01); *H01L 21/02636* (2013.01); *H01L 29/0847* (2013.01); *H01L 29/165* (2013.01); *H01L 29/66636* (2013.01); *H01L 29/66795* (2013.01); *H01L 29/78* (2013.01); *H01L 29/785* (2013.01); *H01L 29/7848* (2013.01); *H01L 21/28079* (2013.01); *H01L 29/495* (2013.01); *H01L 29/66545* (2013.01); *H01L 29/7853* (2013.01)

(58) Field of Classification Search
CPC ............. H01L 29/7848; H01L 21/0243; H01L 29/0847; H01L 29/4232; H01L 29/0843; H01L 29/41783; H01L 29/045
See application file for complete search history.

(56) References Cited

U.S. PATENT DOCUMENTS

| | | | |
|---|---|---|---|
| 7,244,668 B2 | 7/2007 | Kim | |
| 7,361,563 B2 | 4/2008 | Shin | |
| 7,479,432 B2 | 1/2009 | Murthy | |
| 7,518,196 B2* | 4/2009 | Chau ................... | H01L 29/0649 257/401 |
| 7,821,044 B2 | 10/2010 | Bohr et al. | |
| 7,960,236 B2 | 6/2011 | Chopra | |
| 2005/0093075 A1 | 5/2005 | Bentum | |
| 2005/0184345 A1* | 8/2005 | Lin ................. | H01L 21/823418 257/E21.619 |
| 2005/0272187 A1 | 12/2005 | Murthy | |
| 2005/0272262 A1 | 12/2005 | Kim | |
| 2006/0060859 A1 | 3/2006 | Joshi et al. | |
| 2006/0172511 A1 | 8/2006 | Kammler et al. | |
| 2006/0205194 A1 | 9/2006 | Bauer | |
| 2006/0228863 A1 | 10/2006 | Zhang | |
| 2006/0240630 A1 | 10/2006 | Bauer | |
| 2007/0004123 A1 | 1/2007 | Bohr | |
| 2007/0012913 A1 | 1/2007 | Ohta | |
| 2007/0190731 A1 | 8/2007 | Chen | |
| 2007/0238236 A1 | 10/2007 | Cook et al. | |
| 2008/0026531 A1 | 1/2008 | Beyer | |
| 2008/0067557 A1 | 3/2008 | Ming-Hua | |
| 2008/0124878 A1 | 5/2008 | Cook | |
| 2008/0138939 A1 | 6/2008 | Kim | |
| 2008/0182075 A1 | 7/2008 | Chopra | |
| 2008/0230805 A1 | 9/2008 | Hokazono | |
| 2008/0242037 A1 | 10/2008 | Sell et al. | |
| 2008/0242061 A1 | 10/2008 | Simonelli | |
| 2008/0283906 A1* | 11/2008 | Bohr ....................... | H01L 29/165 257/190 |
| 2009/0075029 A1 | 3/2009 | Thomas | |
| 2009/0142894 A1* | 6/2009 | Zhu ................... | H01L 21/26586 257/E21.409 |
| 2009/0166625 A1 | 7/2009 | Ting | |
| 2009/0302348 A1 | 12/2009 | Adam | |

FOREIGN PATENT DOCUMENTS

| | | |
|---|---|---|
| JP | 2008-530784 | 8/2008 |
| JP | 2009-16866 | 1/2009 |
| JP | 2009-147265 | 7/2009 |
| TW | 200939306 | 9/2009 |
| WO | WO 2006083909 | 8/2006 |
| WO | WO 2007/112058 A2 | 10/2007 |
| WO | PCT/US2010/058199 | 11/2010 |

OTHER PUBLICATIONS

Office Action for Chinese Patent Application No. 201610841907.X dated Aug. 4, 2021, 13 pages.
First Office Action for Chinese Patent Application No. 201510829787.7 dated Jan. 17, 2018, 7 pgs., no Translation.
Office Action from Chinese Patent Application No. 201510829787.7, dated Feb. 12, 2019, 15 pgs.
First Office Action for Chinese Patent Application No. 201080058687.4 dated Jul. 10, 2014, 12 pgs., with English Translation.
Notification of 2nd Office Action from China State Intellectual Property Office (SIPO), Chinese Patent Application No. 201080058687.4, dated Mar. 9, 2015 and English Translation thereof.
Third Office Action from China State Intellectual Property Office (SIPO), Chinese Patent Application No. 201080058687.4, dated Sep. 9, 2015 and English Translation thereof.
Fourth Office Action from China State Intellectual Property Office (SIPO), Chinese Patent Application No. 201080058687.4, dated Feb. 22, 2016.
Notice of Allowance for Chinese Patent Application No. 201080058687.4 dated Jul. 8, 2016, 4 pages.
Extended European Search Report for European Patent Application No. 10842433.4 dated Apr. 4, 2014, 16 pgs.
Office Action from European Patent Application No. 10842433.4, dated Jun. 10, 2015, 4 pgs.
Notice of Allowance from European Patent Application No. 10842433.4, dated Mar. 14, 2019, 2 pqs.
Official Communication from the European Patent Office for European Patent Application No. 10842433.4-1552 dated Oct. 6, 2015, 4 pages.
Office Action for European Patent Application No. 10842433.4 dated Apr. 23, 2018, 5 pages.
Extended European Search Report (16 pages) from the European Patent Office dated Jan. 18, 2017 for European Patent Application No. 16177334.6-1552 (6 page).
Communication from the European Patent Office dated Sep. 16, 2016 for European Patent Application No. 16177334.6-1552 (6 page).
Matthais Bauer et al., "Tensile Strained Selective Silicon Carbon Alloys for Recessed Source Drain Area of Devices" ESC Transactions, vol. 3, Jan. 2006, pp. 187-195, XP055301757.
Yee-Chia, Yeo, "Enhancing CMOS Transistor Performance using Lattice-Mismatched Materials in Source/Drain Regions", Semiconductor Science and Technology, IOP Publishing Ltd, GB, vol. 22, No. 1, Jan. 2007, pp. S177y-S182, XP020114895.
Office Action from European Patent Application No. 16177334.6, dated Feb. 11, 2017, 6 pgs.
Communication Pursuant to Article 94(3) EPC for European Patent Application No. 16177334.6 dated Nov. 2, 2017, 6 pgs.
Extended European Search Report for European Patent Application No. 17164305.9 dated Jun. 29, 2017, 16 pgs.
Office Action for Japanese Patent Application No. 2012-539089 dated Oct. 29, 2013, 11 pgs., with English Translation.
Final Office Action for Japanese Patent Application No. 2012-539089 dated Apr. 30, 2014, 4 pgs., with English Translation.
Notice of Allowance for Japanese Patent Application No. 2012-539089 dated Aug. 7, 2014, 3 pages.
Office Action for Korean Patent Application No. 10-2012-7016803 dated Jun. 28, 2013, 6 pqs., English Translation.
Final Office Action for Korean Patent Application No. 10-2012-7016803 dated Jan. 22, 2014, 1 pqs., English Translation.
Notice of Allowance for Korean Patent Application No. 10-2012-7016803 dated Sep. 19, 2014, 3 oas., with English Translation.

(56) References Cited

OTHER PUBLICATIONS

International Search Report and Written Opinion dated Jul. 13, 2011 for PCT/US2010/058199 filed Nov. 29, 2010.
International Preliminary Report on Patentability for PCT Patent Application No. PCT/US2010/058199 (Attorney Docket No. P30296PCT) mailed Jul. 13, 2012, 5 pgs.
Office Action from the Taiwan Patent Office dated Jan. 4, 2016 for Taiwan Patent Application No. 099137761.
Office Action from Taiwan Patent Application No. 99137761, dated Mar. 21, 2015, 13 oas.
Office Action from Taiwan Patent Application No. 99137761, dated Dec. 29, 2016, 4 oas.
Official Letter and Search Report from Taiwan Intellectual Property Office (SIPO), Taiwan Patent Application No. 99137761 dated Jun. 11, 2015 and Summary thereof and English translation of Search Report.
Notice of Allowance (2 pages) from the Taiwan Patent Office dated Nov. 7, 2016 for Taiwan Patent Application No. 99/137,761 and English Translation (1 page) thereof.
Office Action from Chinese Patent Application No. 201510829787.7, dated Sep. 2, 2019, 20 pgs.
Office Action from Chinese Patent Application No. 201610841907.X, dated Jan. 2, 2020, 10 pages.
Office Action from European Patent Application No. 17164305.9, dated Apr. 15, 2020, 7 pgs.
Office Action from Chinese Patent Application No. 201610841907.X, dated Jul. 21, 2020, 8 pgs.
Office Action from European Patent Application No. 16177334.6, dated Sep. 7, 2020, 5 pgs.
Notice of Allowance from Chinese Patent Application No. 201080058687.4, dated Apr. 1, 2020, 5 pgs.
Office Action from Chinese Patent Application No. 201610841907.X, dated Jan. 18, 2021, 3 pgs.
Notice of Allowance from Chinese Patent Application No. 201610841907.X, dated Apr. 28, 2022, 4 pages, with English translation.
Office Action for Chinese Patent Application No. 201610841907.X dated Jan. 5, 2022, 3 pages.

* cited by examiner

US 11,908,934 B2

SEMICONDUCTOR DEVICE HAVING DOPED EPITAXIAL REGION AND ITS METHODS OF FABRICATION

CROSS-REFERENCE TO RELATED APPLICATIONS

This application is a continuation of U.S. patent application Ser. No. 14/059,398, filed Oct. 21, 2013, which is a divisional Application of U.S. patent application Ser. No. 12/643,912, filed Dec. 21, 2009, now U.S. Pat. No. 8,598,003, issued Dec. 3, 2013, the entire contents of which are hereby incorporated by reference herein.

BACKGROUND

1. Field

The present invention relates to the field of semiconductor processing and more particularly to a semiconductor device having doped epitaxial regions and its methods of fabrication.

2. Discussion of Related Art

Increasing the performance of semiconductor devices, in particular transistors, has always been a major consideration in the semiconductor industry. For example, during the design and fabrication of metal oxide semiconductor field effect transistors (MOSFETs), it has always been a common goal to increase the electron mobility of the channel region and to reduce the parasitic resistance to improve device performance.

Other methods of improving device performance include, for example, reducing the overall resistance of the MOSFET by doping the region between the source/drain regions and the channel region, which is referred to as the 'tip' or source/drain extension regions of the MOSFET. For example, a dopant is implanted in the source/drain regions and an annealing step diffuses the dopant towards the channel region. However, there are limits to controlling the dopant concentration and location. Furthermore, the implant and diffusion method does not address the issues of lateral undercut or parasitic resistance at the tip regions.

BRIEF DESCRIPTION OF THE DRAWINGS

FIG. 8E' is a perspective view that illustrates an alternative embodiment of the semiconductor device shown in FIG. 8E.

FIG. 9' is a perspective view that illustrates an alternative embodiment of the semiconductor device shown in FIG. 9.

DETAILED DESCRIPTION

A semiconductor device having doped epitaxial regions and its method of fabrication are described. In the following description, numerous specific details are set forth in order to provide a thorough understanding of the present invention. In other instances, well known semiconductor processing techniques and features have not been described in particular detail in order not to unnecessarily obscure the present invention.

Embodiments of the present invention describe a method of forming epitaxial regions on a semiconductor device. In one embodiment, the epitaxial region is an in-situ carbon and phosphorus doped silicon ($Si_y(C,P)_{1-y}$) region deposited via cyclical deposition-etch process. Cavities created underneath the spacer during the cyclical deposition-etch process are backfilled by a very highly phosphorus doped silicon ($Si_yP_{1-y}$) epitaxial cap layer. The fabrication of the epitaxial region and cap layer stack in a Self-aligned Epi Tip (SET) architecture provides a dramatic transistor performance gain due to combined effects of increased electron mobility gain at channel region, reduced short channel effects (due to carbon suppressing phosphorus diffusion), and reduced parasitic resistance provided by very high phosphorus doping in the ($Si_yP_{1-y}$) epitaxial cap layer.

Figure 1:
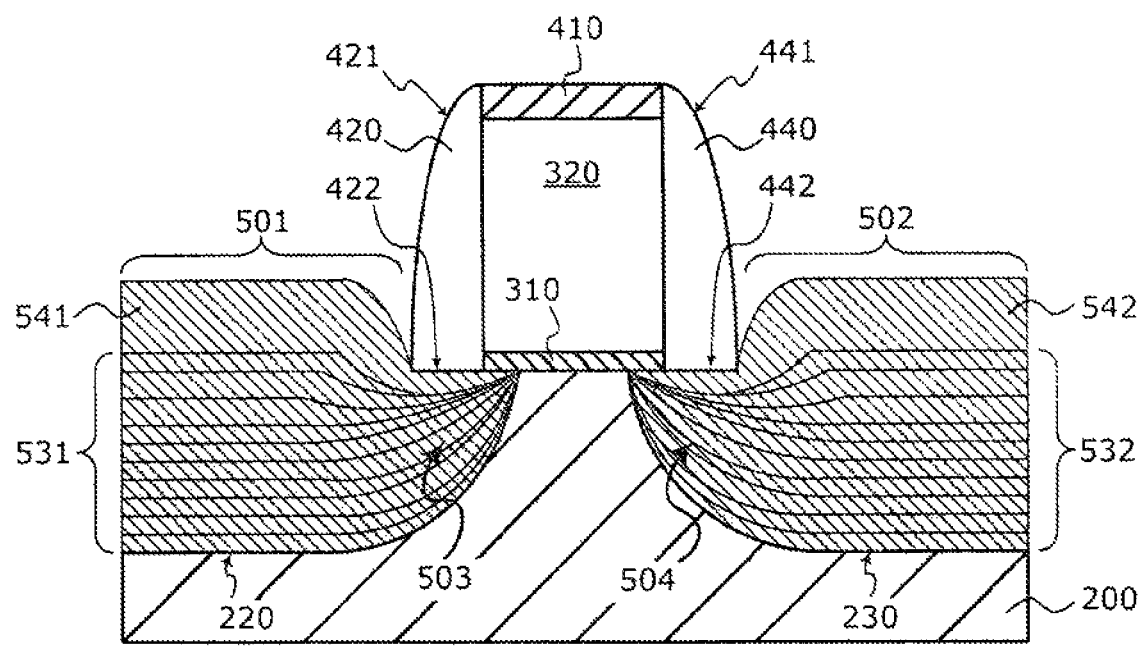
FIG. 1 is a cross-sectional view that illustrates a semiconductor device in accordance with one embodiment of the present invention.

FIG. 1 illustrates a cross-sectional view of a semiconductor device in accordance with one embodiment of the present invention. The semiconductor device comprises a substrate 200 made of a semiconductor material such as, but not limited to, monocrystalline silicon. In one embodiment, the substrate 200 is the silicon film of a silicon on insulator (SOI) substrate, or a multi-layered substrate comprising silicon, silicon germanium, germanium, III-V compound semiconductors.

A gate dielectric 310 is formed over a channel region of the substrate 200. In one embodiment, the dielectric layer 310 is made from any well known insulative material, such as but not limited to silicon oxide (e.g., $SiO_2$). In another embodiment, the dielectric layer 310 is made of a high-k dielectric material having a substantially higher dielectric constant than silicon dioxide (i.e. k>3.9). Examples of high-k dielectric materials include but are not limited to tantalum oxide ($Ta_2O_5$), titanium oxide ($TiO_2$) and hafnium oxide ($HfO_2$).

A gate electrode 320 is formed over the gate dielectric 310. In one embodiment, the gate electrode 320 is made of any well known materials, such as but not limited to polysilicon. In other embodiments, the gate electrode 320 is made of a metal or metal alloy material such as, but not limited to, platinum, tungsten or titanium.

In one embodiment, a hard mask 410 is formed on top of the gate electrode 320. In one embodiment, hard mask 410 is made of a material such as but not limited to silicon nitride or silicon oxynitride. Spacers 420, 440 are formed on opposite sidewalls of the gate electrode 320. In one embodiment, spacers 420, 440 are formed along the entire sidewall width of the gate electrode 320. Spacers 420, 440 comprise sidewalls 421, 441, and bottom surfaces 422, 442. In one embodiment, the spacers 420, 440 are made of a material such as but not limited to a silicon nitride, silicon dioxide or silicon oxynitride.

In an embodiment of the present invention, a recessed source interface 220 and a recessed drain interface 230 are formed on the substrate 200 at opposite sides of the gate electrode 320. In one embodiment, a portion of the recessed source interface 220 extends laterally beneath the bottom surface 422 of the spacer 420 and beneath a portion of the gate electrode 320. Similarly, a portion of the recessed drain interface 230 extends laterally beneath the bottom surface 442 of the spacer 440 and beneath a portion of the gate electrode 320.

A source region 501 is formed over the recessed source interface 220. In an embodiment of the present invention, the source region 501 comprises an epitaxial region 531 formed over the recessed source interface 220. A cap layer 541 is formed over the epitaxial region 531. The source region 501 comprises a source epi-tip region 503 that includes portions of the epitaxial region 531 and cap layer 541 formed directly beneath the spacer 420 and gate dielectric 310.

A drain region 502 is formed over the recessed drain interface 230. In one embodiment, the drain region 502 comprises an epitaxial region 532 formed over the recessed drain interface 230. A cap layer 542 is formed over the epitaxial region 532. The drain region 502 comprises a drain epi-tip region 504 that includes portions of the epitaxial region 532 and cap layer 542 formed directly beneath the spacer 440 and gate dielectric 310. By forming the source and drain epi-tip regions 503, 504 in relatively close proximity to the channel region, a larger hydrostatic stress is induced on the channel region, resulting in higher electron mobility and increasing drive current.

In an embodiment of the present invention, the epitaxial regions 531, 532 comprise silicon and carbon doped with phosphorus. In this case, the semiconductor device shown in FIG. 1 is a NMOS planar or trigate transistor with a Self-aligned Epi Tip (SET) architecture. In one embodiment, the epitaxial regions 531, 532 comprise silicon having a carbon concentration of about 0.5 atomic % to 4 atomic % and a phosphorus concentration of about 9E19 cm$^{-3}$ to 3E21 cm$^{-3}$. In a specific embodiment, the epitaxial regions 531, 532 comprise silicon having a carbon concentration of 2.2 atomic % and a phosphorus concentration of 2E20 cm$^{-3}$. The substitutional carbon (over 2 atomic %) in the epitaxial regions 531, 532 of the source and drain regions 501, 502 impart hydrostatic stress on the channel region, which enhances electron mobility. Furthermore, the substitutional carbon suppresses any phosphorus diffusion during any subsequent thermal anneals, thus reducing short channel effects.

In an embodiment of the present invention, the cap layers 541, 542 are epitaxial layers comprising silicon doped with phosphorus. In one embodiment, the cap layers 541, 542 comprise silicon having a phosphorus concentration of about 8E19 cm$^{-3}$ to 3E21 cm$^{-3}$. In a specific embodiment, the cap layers 541, 542 comprise silicon having a phosphorus concentration of 2E21 cm$^{-3}$. The high phosphorus concentration level in the cap layers 541, 542 reduces parasitic resistance, particularly in contact resistance between salicide and source/drain regions 501, 502.

Figure 2:
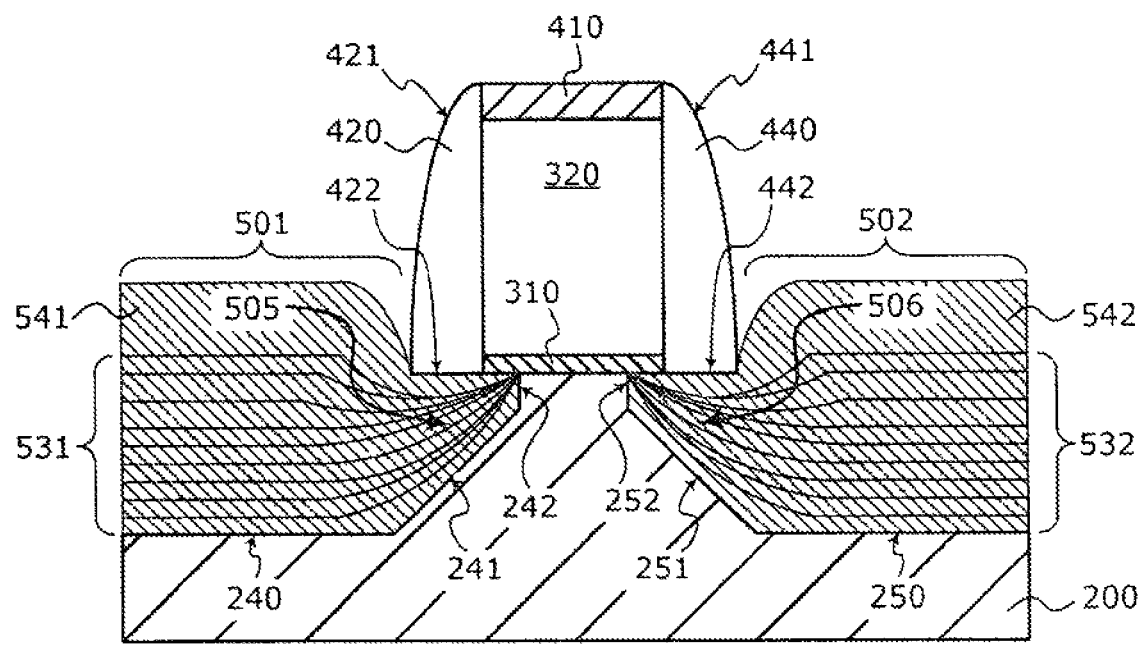
FIG. 2 is a cross-sectional view that illustrates a semiconductor device in accordance with another embodiment of the present invention.

FIG. 2 illustrates a cross-sectional view of a semiconductor device similar to FIG. 1. The substrate 200 is made of {001} silicon, and comprises a recessed source interface 240 having a {111} facet 241 in the {111} crystallographic plane of the {001} silicon substrate 200, and a recessed drain interface 250 having a {111} facet 251 in the {111} crystallographic plane of the {001} silicon substrate 200. The {111} facets 241, 251 provide reduced volume in depletion and corresponding improved control of short channel effects. In one embodiment, the recessed source and drain interfaces 240, 250 each further comprises a {010} facet 242, 252 in the {010} crystallographic plane of the {001} silicon substrate 200, where the {010} facets 242, 252 extend directly beneath the gate electrode 320. The {010} facets 242, 252 contribute to more precisely defining the metallurgical channel length of the semiconductor device and reduce short channel effects.

Similar to FIG. 1, the semiconductor device shown in FIG. 2 comprises a source region 501 and a drain region 502, each having an epitaxial region 531, 532 and a cap layer 541, 542. Epitaxial regions 531, 532 and cap layers 541, 542 are formed over the recessed source and drain interfaces 240, 250 including their {111} facets 241, 251 and {010} facets 242, 252. The source region 501 comprises a source epi-tip region 505 that includes portions of the epitaxial region 531 and cap layer 541 surrounded by the spacer 420, the gate dielectric 310 and the {111}, {010} facets 241, 242. The drain region 502 comprises a drain epi-tip region 506 that includes portions of the epitaxial region 532 and cap layer 541 surrounded by the spacer 440, the gate dielectric 310 and the {111}, {010} facets 251, 252. Forming the source and drain epi-tip regions 505, 506 in relatively close proximity to the channel region induces a larger hydrostatic stress on the channel region, thus increasing electron mobility which results in higher drive current.

Figure 3:
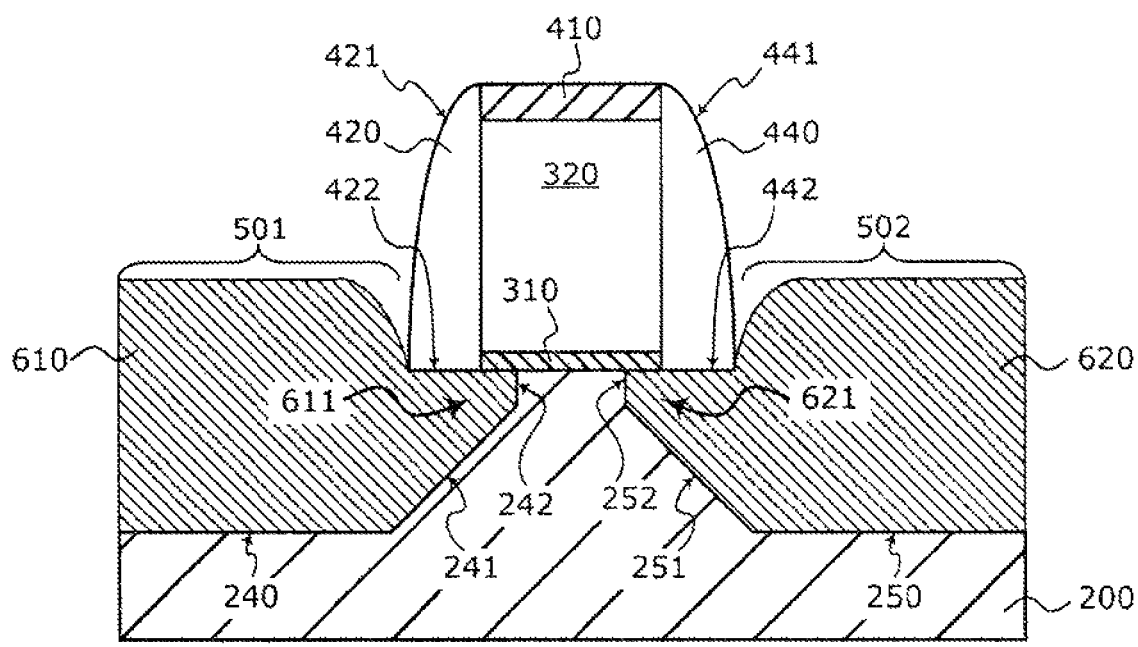
FIG. 3 is a cross-sectional view that illustrates a semiconductor device in accordance with another embodiment of the present invention.

FIG. 3 illustrates a cross-sectional view of a semiconductor device similar to FIG. 2. In one embodiment, the source and drain regions 501, 502 each comprises an epitaxial layer 610, 620 formed over the recessed source and drain interfaces 240, 250 including their {111} facets 241, 251 and {010} facets 242, 252.

The source region 501 comprises a source epi-tip region 611 that includes portions of the epitaxial layer 610 surrounded by the spacer 420, the gate dielectric 310 and the {111}, {010} facets 241, 242. The drain region comprises a drain epi-tip region 621 that includes portions of the epitaxial layer 610 surrounded by the spacer 440, the gate dielectric 310 and the {111}, {010} facets 251, 252. Forming the source and drain epi-tip regions 611, 621 in relatively close proximity to the channel region induces a larger hydrostatic stress on the channel region, thus increasing electron mobility which results in higher drive current.

In an embodiment of the present invention, the epitaxial layer 610, 620 comprises silicon doped with phosphorus. In one embodiment, the epitaxial layers 610, 620 comprise silicon having a phosphorus concentration of about 8E19 cm$^{-3}$ to 3E21 cm$^{-3}$. In a specific embodiment, the epitaxial layers 610, 620 comprise silicon having a phosphorus concentration of 2E21 cm$^{-3}$. The high phosphorus concentration level in the epitaxial layers 610, 620 reduces parasitic resistance, particularly in contact resistance between salicide and source/drain regions 501, 502.

Figure 4:
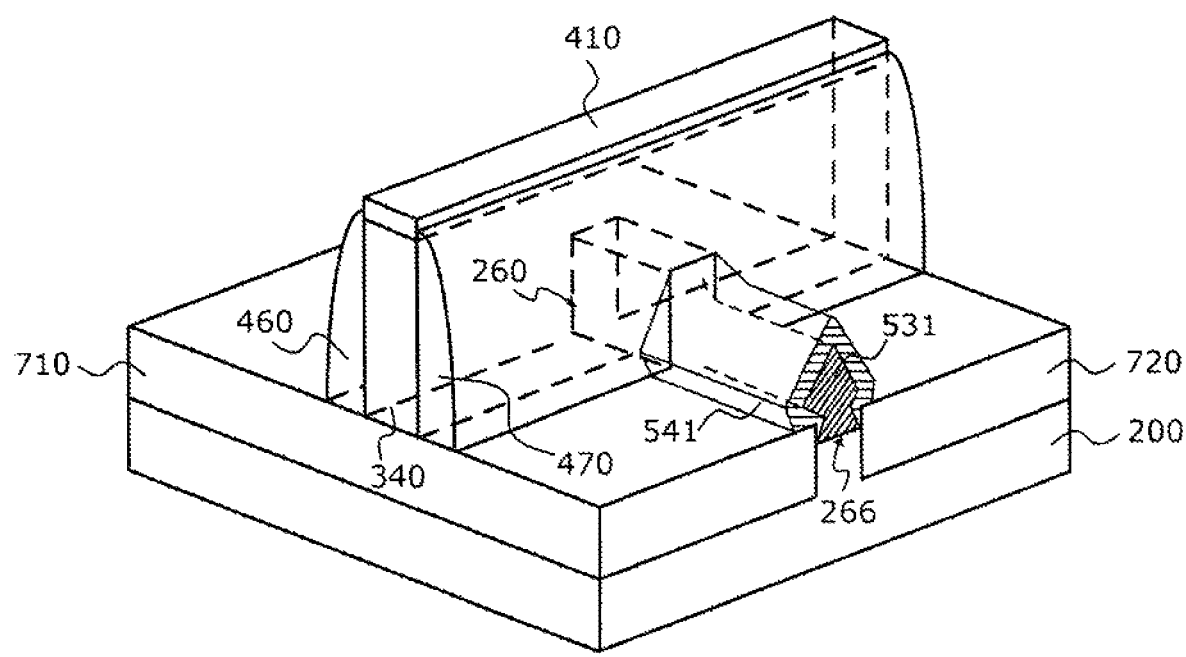
FIG. 4 is a perspective view that illustrates a semiconductor device in accordance with another embodiment of the present invention.

FIGS. 1, 2 and 3 illustrate the application of epitaxial regions in planar transistors to enhance electron mobility at the channel region or to reduce contact resistance at the source/drain regions. It can be appreciated that the epitaxial regions are not limited to planar transistors but can be fabricated on other devices, such as but not limited to a tri-gate transistor. FIG. 4 illustrates a perspective view of a tri-gate device comprising a substrate 200 having a semiconductor body or fin 260 (represented by dashed lines). A gate electrode 340 is formed over 3 surfaces of the fin 260 to form 3 gates. A hard mask 410 is formed on top of the gate electrode 340. Gate spacers 460, 470 are formed at opposite sidewalls of the gate electrode 340. The source region comprises the epitaxial region 531 formed on a recessed source interface 266 and on a fin 260 sidewall. The cap layer 541 is deposited over the epitaxial region 531.

Figure 5A:
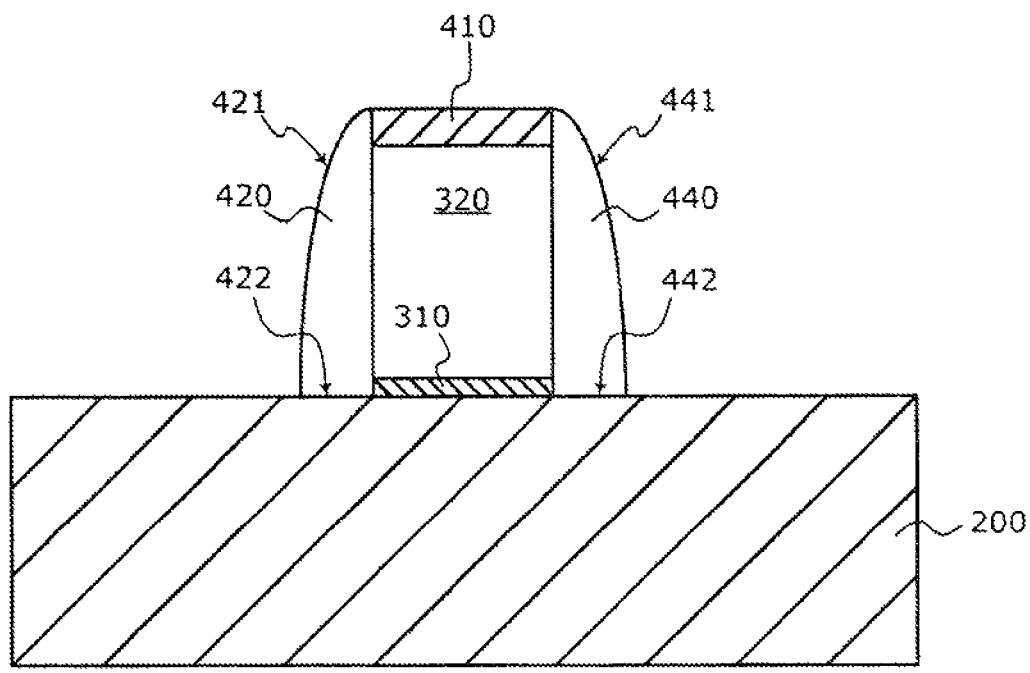
FIGS. 5A-5F are cross-sectional views that illustrate the method of fabricating the semiconductor device shown in FIG. 1.

FIGS. 5A-5F illustrate a method of forming the semiconductor device as discussed in relation to FIG. 1. The fabrication of the semiconductor device begins by providing the substrate 200 as shown in FIG. 5A. The gate dielectric 310 is formed over a desired channel region of the substrate 200. In one embodiment, the gate dielectric 310 is formed by any well known methods, such as but not limited to physical vapor deposition (PVD), chemical vapor deposition (CVD) or atomic layer deposition (ALD).

The gate electrode 320 is formed over the gate dielectric 310. In an embodiment of the present invention, the gate electrode 320 is a sacrificial gate electrode that is subsequently replaced by an actual gate electrode in a replacement gate process. The hard mask 410 is formed on top of the gate electrode 320. In an embodiment of the present invention, gate electrode 320 and hard mask 410 are deposited using PVD or CVD, and then patterned using well known photolithography and etching techniques.

Spacers 420, 440 are then formed on opposite sidewalls of the gate electrode 320. Spacers 420, 440 comprises sidewalls 421, 441, and bottom surfaces 422, 442 that are formed on the top surface of the substrate 200. In one embodiment, the spacers 420, 440 are formed by using well known techniques, such as depositing a layer of spacer material over the entire substrate 200 including the gate electrode 320, and then anisotropically etching the layer of spacer material to form the spacers 420, 440 on the sidewalls of gate electrode 320.

Figure 5B:
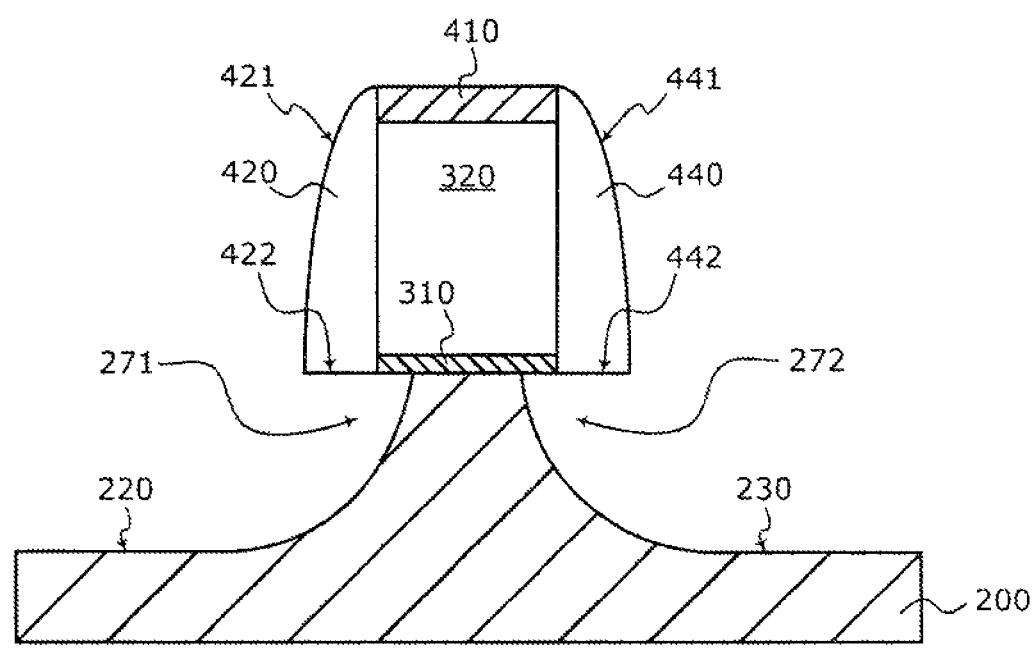

Next, a source region and a drain region are formed on the substrate 200. In an embodiment of the present invention, fabrication of the source and drain regions begins by recessing portions of the substrate 200 using well known etching techniques, such as but not limited to dry etching or wet etching. In an embodiment of the present invention, a wet etching comprising an etchant chemistry that is substantially selective to the substrate 200 is utilized to recess the substrate 200 so as to form a recessed source interface 220 and a recessed drain interface 230 as shown in FIG. 5B.

In one embodiment, the wet etching undercuts the spacers 420, 440 and forms a source epi-tip cavity 271 between the bottom surface 422 of spacer 420 and the recessed source interface 220, and forms a drain epi-tip cavity 272 between the bottom surface of spacer 440 and the recessed drain interface 230. As a result, the source epi-tip cavity 271 and drain epi-tip cavity 272 expose the bottom surfaces 422, 442 of the spacers 420, 440. In one embodiment, the source epi-tip cavity 271 and drain epi-tip cavity 272 also expose portions of the gate dielectric 310. As a result, a portion of the recessed source interface 220 extends laterally beneath the spacer 420 and beneath a portion of the gate electrode 320. Similarly, a portion of the recessed drain interface 230 extends laterally beneath the spacer 440 and beneath a portion of the gate electrode 320.

It can be appreciated that the wet etching can be controlled (e.g. by adjusting the etching duration) so that the source and drain epi-tip cavities 271, 272 do not expose the gate dielectric 310. For instance, the recessed source interface 220 only extends laterally beneath the spacer 420, and the recessed drain interface 230 only extends laterally beneath the spacer 440.

In an embodiment of the present invention, the recessed source and drain interfaces 220, 230 define the channel region of the semiconductor device. The channel region refers to the portion of the substrate 200 located directly beneath the gate dielectric 310 and between the recessed source and drain interfaces 220, 230.

Next, an epitaxial region is deposited over each of the recessed source and drain interfaces 220, 230 by alternatingly exposing the substrate 200 to a first precursor and a second precursor. Fabrication of the epitaxial region begins, in FIG. 5C, by exposing the entire substrate 200 to the first precursor so as to deposit epitaxial films 511, 512 on the recessed source and drain interfaces 220, 230. In the case where the substrate 200 is made of monocrystalline silicon, the recessed source and drain interfaces 220, 230 are monocrystalline surfaces that allow epitaxial growth of the epitaxial films 511, 512 thereon. On the other hand, the hard mask 410, the spacers 420, 440, and the gate dielectric 310 are non-crystalline surfaces. As a result, an amorphous layer 513 is deposited on the top surface of the hard mask 410, on the sidewalls 421, 441 and bottom surfaces 422, 442 of the spacers 420, 440, and on portions of the bottom surface of the gate dielectric 310.

In an embodiment of the present invention, the first precursor comprises a silicon-containing compound, a carbon-containing compound, and a dopant. In one embodiment, the silicon-containing compound includes, but not limited to, silanes and halogenated silanes. Such silicon-containing compound includes silane ($SiH_4$), disilane ($Si_2H_6$), trisilane ($Si_3H_8$), dichlorosilane ($SiH_2Cl_2$), and penta-chloro silane.

In one embodiment, the carbon-containing compound includes, but not limited to, organosilanes. For example, the carbon-containing compound comprises mono-methyl silane ($CH_3$—$SiH_3$). In one embodiment, the carbon-containing compound is mixed with hydrogen ($H_2$) or argon. For example, mono-methyl silane ($CH_3$—$SiH_3$) is mixed with hydrogen ($H_2$) or argon with the $CH_3$—$SiH_3$ concentration in the range of 0.5% to 20%.

In an embodiment of the present invention, the dopant is a n-type dopant such as, but not limited to, phosphorus or arsenic. In one embodiment, the Phosphorus dopant is incorporated in the epitaxial film using phosphine ($PH_3$) without any dilution in Hydrogen or an inert gas, such as $N_2$ or Ar. In another embodiment, the phosphine gas is mixed with hydrogen, for example as a mixture of 3% phosphine ($PH_3$) in hydrogen ($H_2$).

In one embodiment, the first precursor is delivered or released onto the substrate 200 with a carrier gas. In one embodiment, the carrier gas includes, but is not limited to, hydrogen ($H_2$), or any inert gas such as nitrogen ($N_2$) argon and helium and any combinations thereof.

In an embodiment of the present invention, the substrate 200 is exposed to the first precursor at a temperature of about 500 to 700 degrees Celsius, at a pressure of about 5 to 300 torr, and for a time duration of about 3 to 60 seconds. In a specific embodiment, the substrate 200 is exposed to the first precursor at a temperature of 600 degrees Celsius, at a pressure of 30 torr, and for a time duration of 15 seconds.

In one embodiment, the epitaxial films 511, 512 are grown to have a thickness of about 6 to 100 Angstroms. In a specific embodiment, the epitaxial films 511, 512 are grown to have a thickness of 50 Angstroms. In the case where the first precursor uses a phosphorus dopant, the deposited epitaxial films 511, 512 are crystalline films containing silicon and carbon doped with phosphorus (i.e. in-situ carbon and phosphorus doped silicon layer). The amorphous layer 513 contains silicon and carbon doped with phosphorus.

An optional surface pre-treatment can be performed on the substrate 200 before exposing it to the first precursor to facilitate epitaxial growth and reduce surface defects. In an embodiment of the present invention, the surface pre-treatment includes a hydrogen bake treatment performed on the substrate 200 (in FIG. 5B) to clean the recessed source and drain interfaces 220, 230. The hydrogen bake treatment desorbs oxygen and renders surface reconstruction so that the epitaxial films 511, 512 can readily nucleate without formation of defects. In one embodiment, the hydrogen bake treatment is performed at around 700 to 1050 degrees Celsius for a duration of about 10 to 120 seconds. In an embodiment of the present invention, hydrogen chloride (HCl) is added to the hydrogen bake treatment. The hydrogen chloride (HCl) enables removal of about 1 to 3 monolayers of the recessed source and drain interfaces 220, 230 so that they are free of oxygen, hydrocarbons and any other contaminants. In one embodiment, the hydrogen bake treatment with hydrogen chloride (HCl) is performed at a lower temperature of around 700 to 900 degrees Celsius for a duration of about 10 to 120 seconds. Alternatively, chlorine ($Cl_2$), germane ($GeH_4$) or phosphine ($PH_3$) can be used as an additional or alternative chemical compound for hydrogen chloride (HCl).

In an alternative embodiment, the surface pre-treatment utilizes an etch step to clean the recessed source and drain interfaces 220, 230. In one embodiment, the etch step uses an etchant gas, such as but not limited to hydrogen ($H_2$), anhydrous hydrochloric acid (HCl), or a mixture of germane ($GeH_4$) and hydrogen ($H_2$). In another embodiment, the surface pre-treatment uses a combination of the etch step and the hydrogen bake treatment.

Before exposing the substrate 200 to the second precursor, a purging process can be performed to remove the first precursor and other by-products from the substrate 200. In one embodiment, the purging process injects an inert gas, such as but not limited to nitrogen ($N_2$), helium or argon to remove any unreacted first precursor or by-products.

Figure 5C:
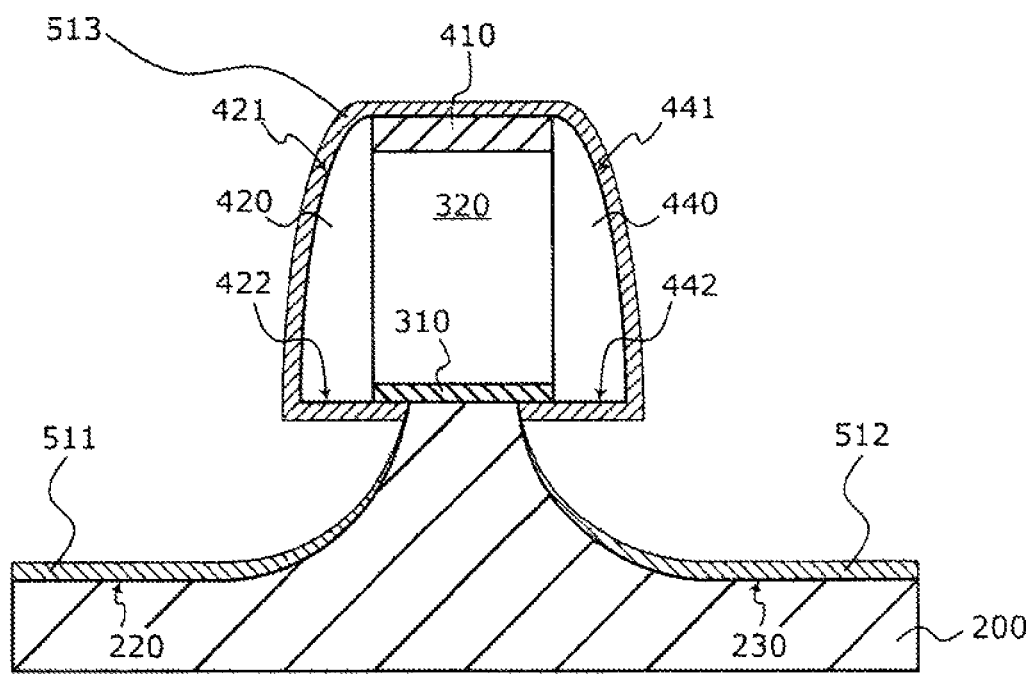
Figure 5D:
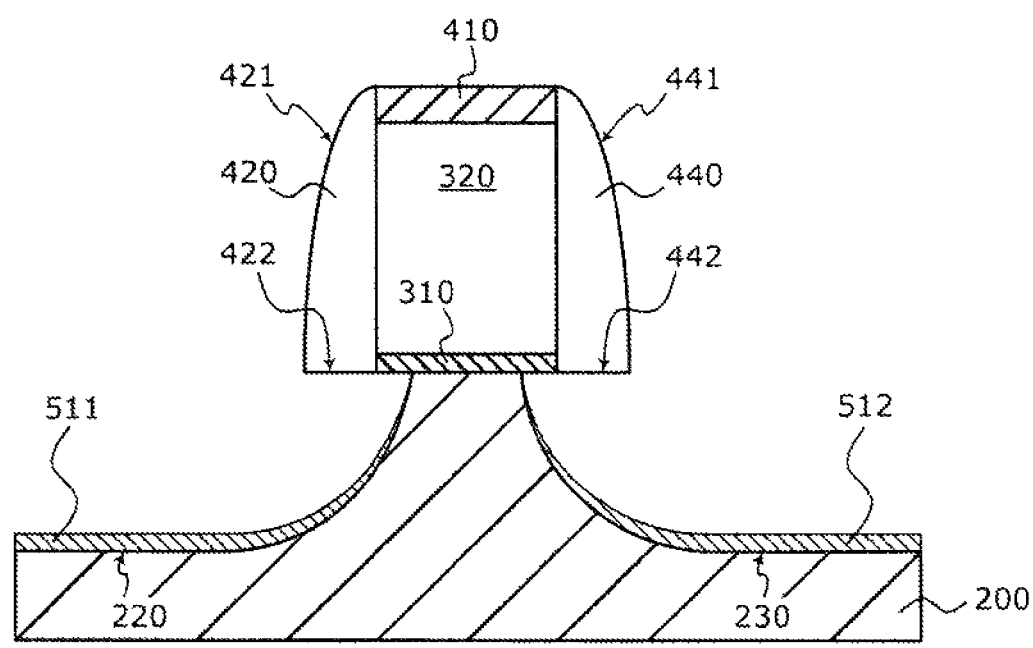

Next, in FIG. 5D, the entire substrate 200 is exposed to the second precursor to remove the amorphous layer 513 from the sidewalls 421, 441 and bottom surfaces 422, 442 of the spacers 420, 440. Furthermore, the second precursor also removes any amorphous layer 513 formed on the hard mask 410 and beneath the gate dielectric 310.

In one embodiment, the second precursor 900 uses an etchant chemistry that etches the amorphous layer 513 faster than the epitaxial films 511, 512. In one embodiment, the second precursor 900 is an etchant gas, such as but not limited to hydrogen ($H_2$), anhydrous hydrochloric acid (HCl), and a mixture of germane ($GeH_4$) and hydrogen ($H_2$). Germane ($GeH_4$) enables etch through catalysis, thus providing high etch rate at low temperatures.

In one embodiment, the substrate 200 is exposed to the second precursor at a pressure of about 30 to 300 torr, and for a time duration of about 5 to 60 seconds. In a specific embodiment, the substrate 200 is exposed to the second precursor at a pressure of 80 torr, and for a time duration of 20 seconds. In one embodiment, the temperature is maintained at substantially the same level when exposing the substrate 200 to both the first precursor and the second precursor.

Due to the weak chemical bonding between the amorphous layer 513 and the hard mask 410, spacers 420, 440 and gate dielectric 310, the second precursor easily removes the amorphous layer 513 deposited thereon. The second precursor reacts with the amorphous layer 513 to convert it into by-products, thus removing the amorphous layer 513 from the hard mask 410, spacers 420, 440 and gate dielectric 310.

On the other hand, the epitaxial films 511, 512 have strong chemical bonds with the recessed source and drain interfaces 220, 230. Due to the strong chemical bonds, only small portions of the epitaxial films 511, 512 are removed by the second precursor. In one embodiment, the thickness of the epitaxial films 511, 512 deposited during FIG. 5C or the duration of exposing the second precursor to the substrate 200 in FIG. 5D can be adjusted so as to effectively remove the amorphous layer 513 while maintaining sufficient thickness for the epitaxial films 511, 512.

FIGS. 5C and 5D illustrate one deposition-etch cycle of forming the epitaxial films 511, 512 over the recessed source and drain interfaces 220, 230. In one embodiment, the deposition-etch cycle is repeated using the same type of first and second precursors until a desired number of epitaxial films are deposited. For example, FIG. 5E shows epitaxial regions 531, 532 containing ten epitaxial films each.

It can be appreciated that the epitaxial regions 531, 532 are not limited to only ten layers of epitaxial films each. In one embodiment, about 3 to 100 deposition-etch cycles are performed to form the epitaxial regions 531, 532. In a specific embodiment, 30 deposition-etch cycles are performed to form the epitaxial regions 531, 532 having a thickness of around 30 nanometers.

In an embodiment of the present invention, the epitaxial regions 531, 532 are deposited with a graded concentration of carbon or phosphorus. The carbon and phosphorus concentration of each epitaxial film deposition can be optimized to provide optimal selectivity and defect-free epitaxy. Furthermore, the graded carbon or phosphorus concentration promotes the removal of the amorphous material during the deposition-etch cycles. In one embodiment, the graded carbon concentration of the epitaxial regions 531, 532 (shown in FIG. 5E) begins at around 0.5 atomic % for the lowest epitaxial film and is gradually increased to a desired level of about 2 atomic % in the uppermost epitaxial film. In another embodiment, the graded phosphorus concentration level of the epitaxial regions 531, 532 begins at around $8E19$ $cm^{-3}$ for the lowest epitaxial film and is gradually increased to a desired level of around $2E21$ $cm^{-3}$ in the uppermost epitaxial film. In one embodiment, the epitaxial regions 531, 532 are deposited with a combination of graded carbon concentration (0.5-2 atomic %) and graded phosphorus concentration ($8E19$-$2E21$ $cm^{-3}$).

Figure 5E:
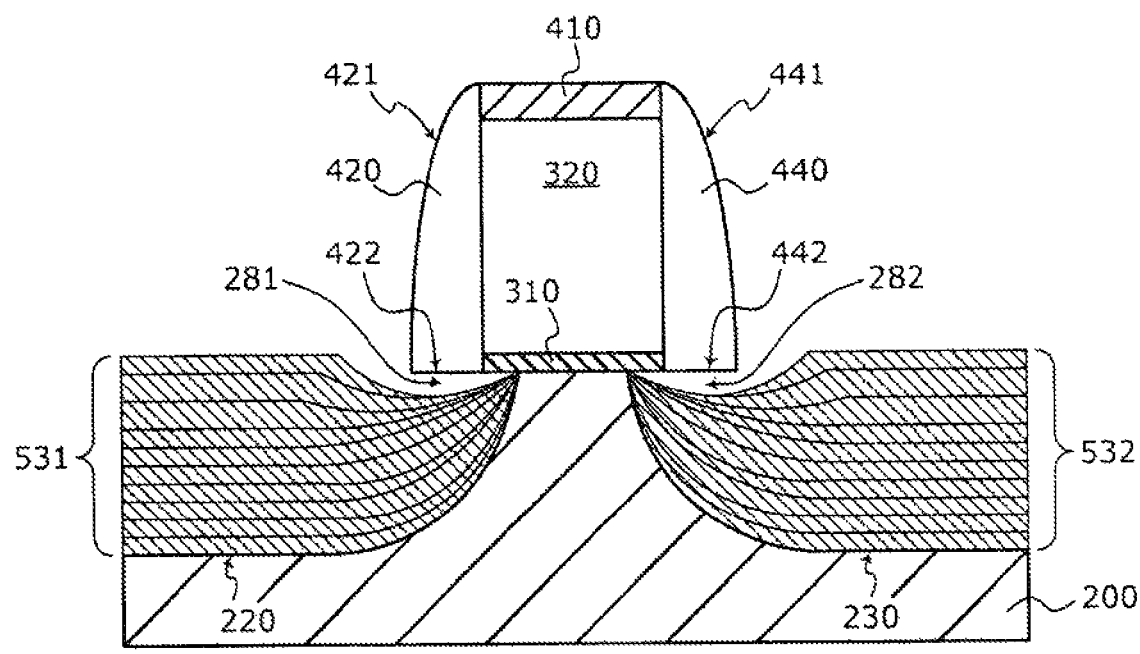
Figure 5F:
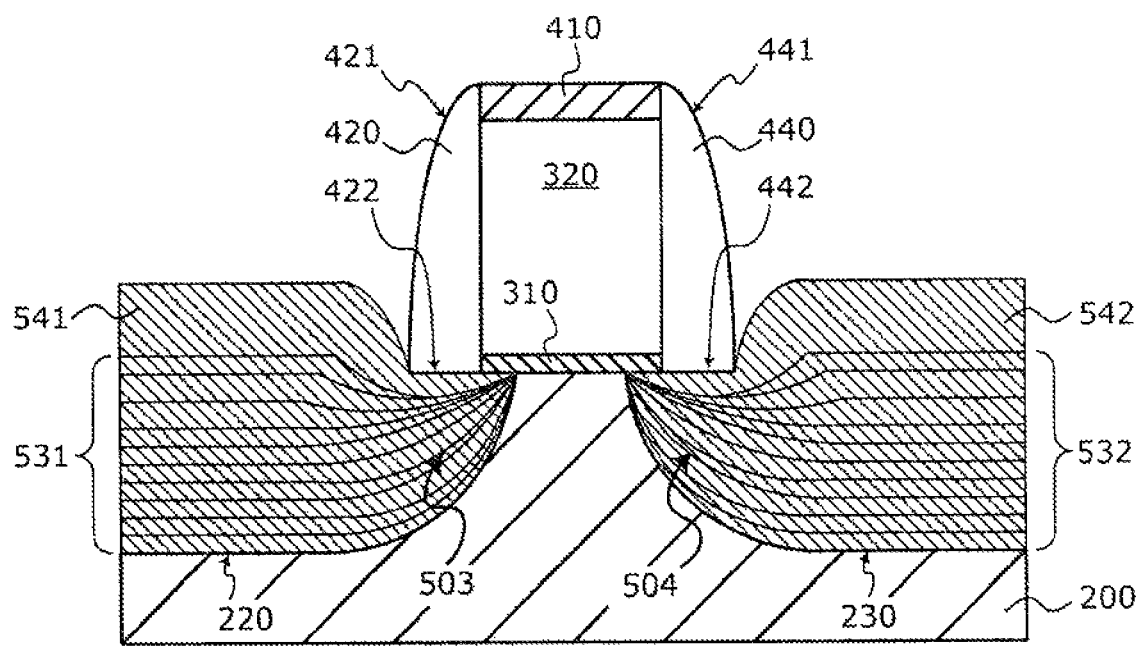

The epitaxial regions 531, 532 are selectively formed over the recessed source and drain interfaces 220, 230 as shown in FIG. 5E. However, the removal of the amorphous layer 513 during each deposition-etch cycle results in voids or cavities 281, 282 formed between the bottom surfaces 422, 442 of spacers 420, 440 and the top surfaces of the epitaxial regions 531, 532. In one embodiment, the cavities 281, 282 also extend between portions of the gate dielectric 310 and the epitaxial regions 531, 532. The cavities 281, 282 may cause detrimental effects on the transistor performance, and thus need to be eliminated. In an embodiment of the present invention, the cavities 281, 282 are substantially backfilled by cap layers 541, 542 selectively deposited over the epitaxial regions 531, 532 as shown in FIG. 5F.

In an embodiment of the present invention, the cap layers 541, 542 are selectively deposited over the epitaxial regions 531, 532 in a single deposition process by exposing the substrate 200 to a third precursor. In one embodiment, the third precursor comprises the same silicon-containing compound and dopant of the first precursor, and the same etchant gas of the second precursor.

In the case where the epitaxial regions 531, 532 are crystalline films having silicon and carbon doped with phosphorus, the third precursor uses the same phosphorus dopant to form cap layers 541, 542. The crystalline surfaces of the epitaxial layers 531, 532 allow epitaxial growth of cap layers 541, 542 thereon, and as a result, the cap layers 541, 542 are epitaxial layers containing silicon doped with phosphorus. Apart from backfilling the cavities, the phosphorus doped silicon cap layers 541, 542 provides an advantage of inducing tensile stress on the channel region, thereby increasing electron mobility and improving the device performance.

In one embodiment, a co-flown deposition technique is used to expose the substrate 200 to the silicon-containing compound, the dopant, and the etchant gas at the same time. In one embodiment, the etchant gas does not include germane ($GeH_4$). During deposition, the etchant gas easily removes any silicon and phosphorus-containing compound that are weakly bonded on the hard mask 410 and spacers 420, 440 so that the cap layers 541, 542 are deposited over the epitaxial regions 531, 532 and not deposited on the hard mask 410 or the spacers 420, 440.

In an embodiment of the present invention, the substrate 200 is exposed to the third precursor at a temperature of about 550 to 800 degrees Celsius, at a pressure of about 10 torr to atmospheric pressure, and for a time duration of about 30 to 900 seconds. In a specific embodiment, the substrate 200 is exposed to the first precursor at a temperature of 635 degrees Celsius, at a pressure of 600 torr, and for a time duration of 180 seconds. In one embodiment, the cap layers 541, 542 are grown to have a thickness of about 50 to 500 Angstroms. In a specific embodiment, the cap layers 541, 542 are grown to have a thickness of 300 Angstroms.

Portions of the epitaxial region 531 and cap layer 541 directly beneath the spacer 420 and gate dielectric 310 forms the source epi-tip region 503. Similarly, portions of the epitaxial region 532 and cap layer 542 directly beneath the spacer 440 and gate dielectric 310 forms the drain epi-tip region 504. By forming the source and drain epi-tip regions 503, 504 in relatively close proximity to the channel region, a larger hydrostatic stress is induced on the channel region, resulting in higher electron mobility and increasing drive current. The stress can be further amplified by increasing the carbon concentrations of the source and drain epi-tip regions 503, 504 during fabrication of the epitaxial regions 531, 532. Furthermore, the carbon concentrations of the source and drain epi-tip regions 503,504 also help to suppress any phosphorus diffusion during subsequent thermal anneals.

In an embodiment of the present invention, the gate electrode 320 is a sacrificial gate electrode that is subsequently replaced by an actual gate electrode in a replacement gate process. In one embodiment, the replacement gate process begins by depositing a mask on the cap layers 541, 542 and then planarizing the mask to be coplanar with the hard mask 410 (not shown). Next, the hard mask 410 and gate electrode 320 are removed using well known etching techniques. After removing the hard mask 410 and gate electrode 320, the actual gate electrode is then deposited on the gate dielectric 310. In one embodiment, the actual gate electrode is a metal gate electrode comprising materials such as, but not limited to, platinum, tungsten or titanium. This completes the fabrication of the semiconductor device shown in FIG. 1.

Figure 6A:
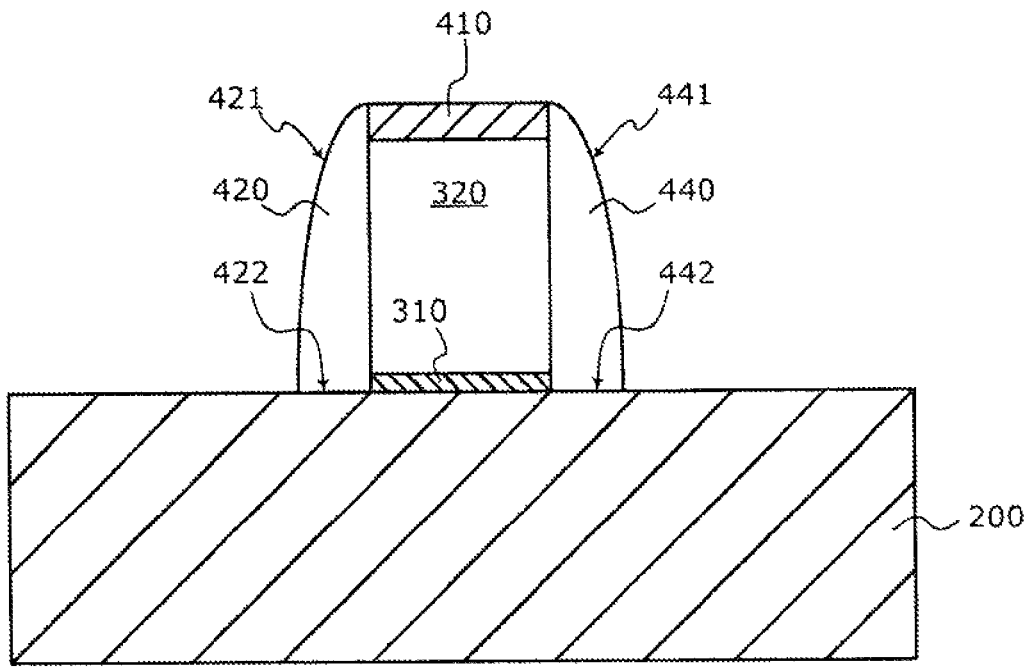
FIGS. 6A-6F are cross-sectional views that illustrate the method of fabricating the semiconductor device shown in FIG. 2.

FIGS. 6A-6F illustrate a method of forming the semiconductor device as discussed in relation to FIG. 2. The fabrication of the semiconductor device begins by providing the substrate 200 as shown in FIG. 6A. The semiconductor device shown in FIG. 6A is the same as FIG. 5A, and thus will not be discussed in detail. Briefly, the semiconductor device comprises the gate dielectric 310 formed over a desired channel region of the substrate 200. The gate electrode 320 is formed over the gate dielectric 310. In an embodiment of the present invention, the gate electrode 320 is a sacrificial gate electrode that is subsequently replaced by an actual gate electrode in a replacement gate process. Hard mask 410 is formed on top of the gate electrode and spacers 420, 440 are formed at the sidewalls of the gate electrode 320.

Figure 6B:
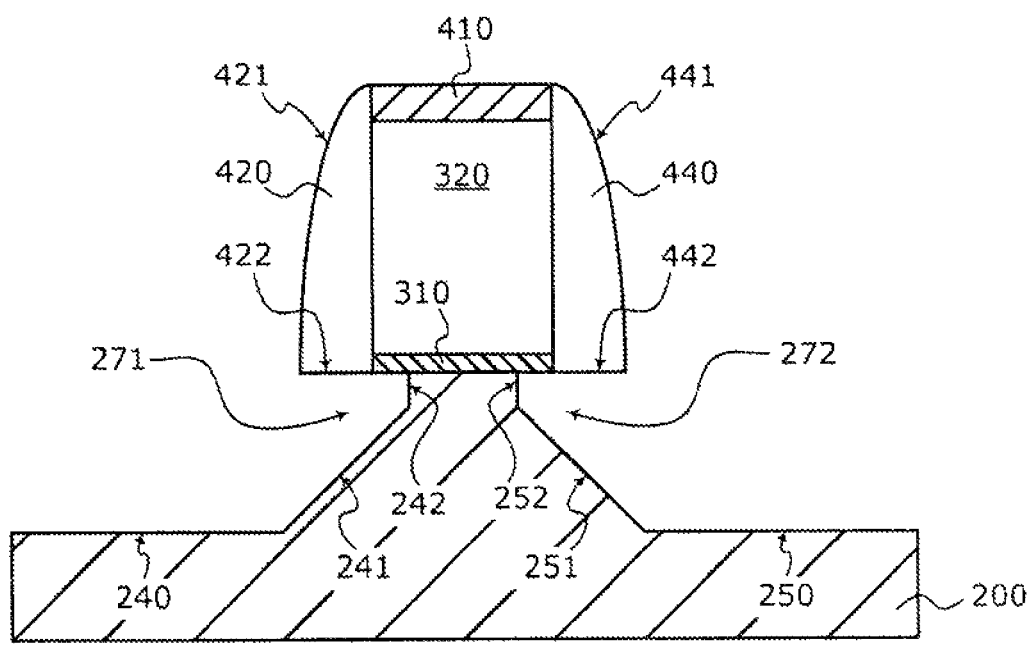

Next, a source region and a drain region are formed on the substrate 200. In an embodiment of the present invention, fabrication of the source and drain regions begins by recessing portions of the substrate 200 using well known etching techniques, such as but not limited to dry etching or wet etching. In an embodiment of the present invention, a wet etching that is substantially selective to the substrate 200 is utilized to recess the substrate 200 so as to form a recessed source interface 240 and a recessed drain interface 250 as shown in FIG. 6B.

In an embodiment of the present invention, the substrate 200 is made of {001} silicon. The wet etch uses an etchant chemistry that etches the {001} silicon substrate 200 based on crystallographic direction, and in particular etches the {001} silicon substrate 200 much more slowly along its {111} crystallographic plane to form the {111} facets 241, 251 as the etch proceeds much more rapidly in other crystallographic directions. As a result, a source epi-tip cavity 271 is formed between the bottom surface 422 of spacer 420 and the {111} facet 241. A drain epi-tip cavity 272 is formed between the bottom surface of spacer 440 and the {111} facet 251.

The wet etch chemistry includes, but not limited to, an ammonia-based or amine-based etchant. Examples of ammonia-based etchants are ammonium hydroxide (NH4OH), tetramethylammonium hydroxide (TMAH) and benzyltrimethylammonium hydroxide (BTMH). The wet etch chemistry includes other types of etchants, such as potassium hydroxide (KOH) and sodium hydroxide (NaOH).

In one embodiment, the wet etch further creates {010} facets 242, 252 in the channel region of the {001} silicon substrate 200. The {010} facets 242, 252 extends directly beneath the gate dielectric 310. In a specific embodiment, {010} facets 242, 252 are formed up to a length of around 3 nanometers from the gate dielectric 310.

Figure 6C:
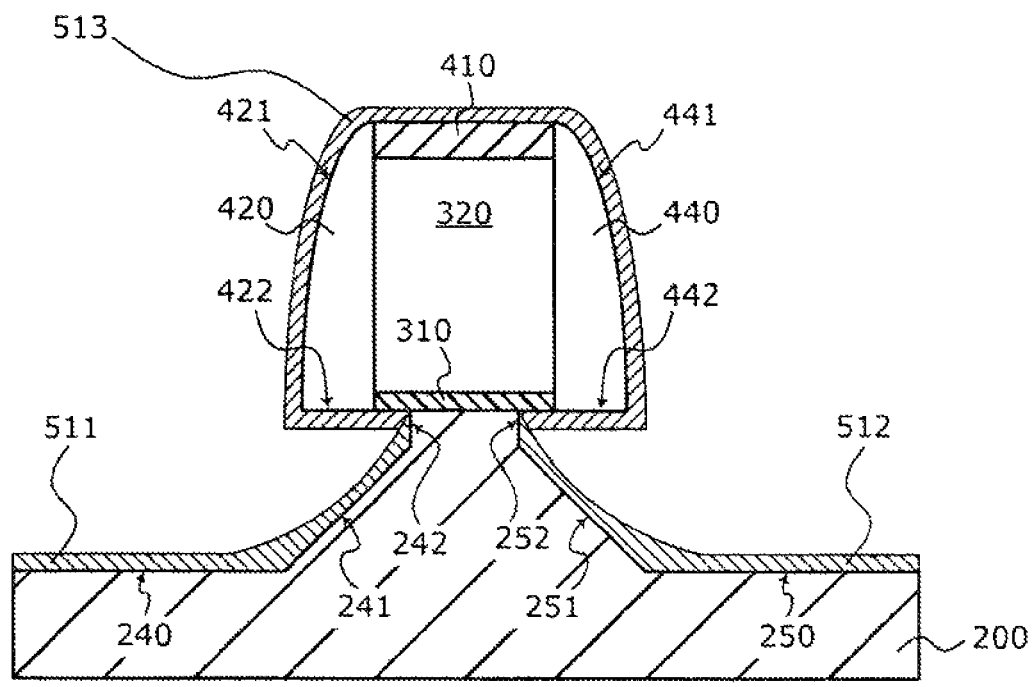
Figure 6D:
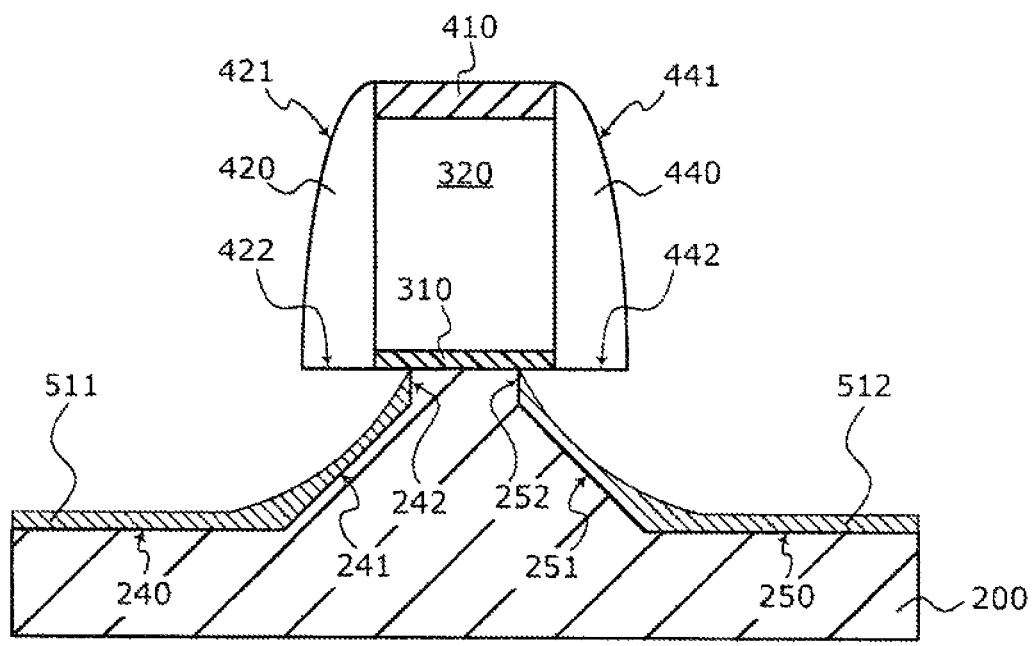
Figure 6E:
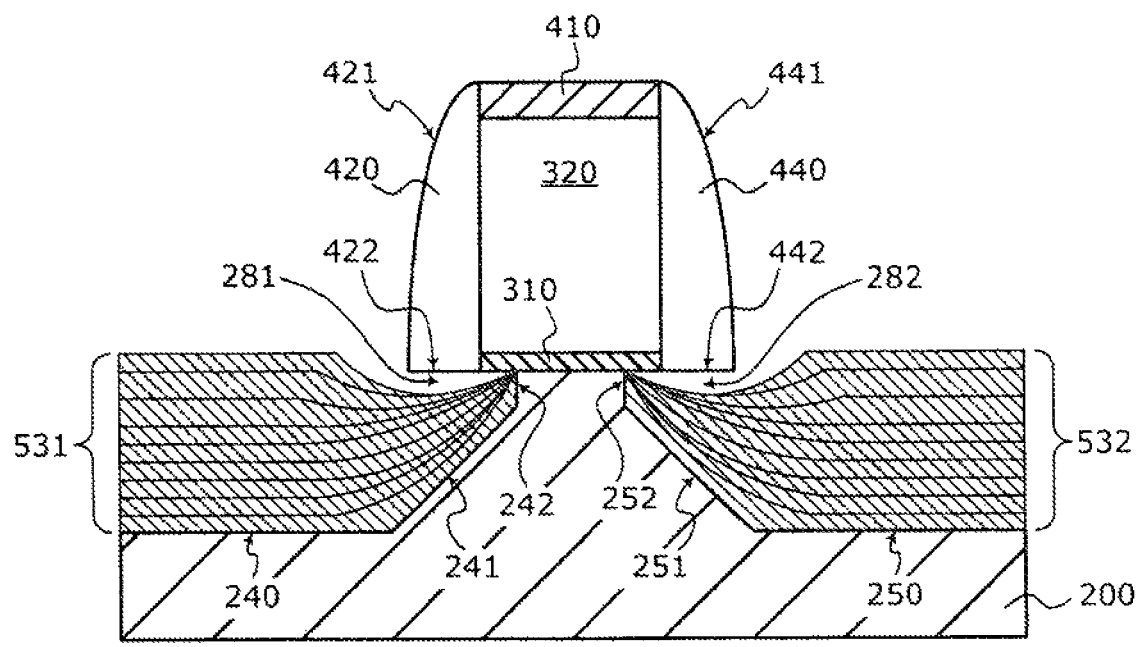

Next, an epitaxial region is deposited over each of the recessed source and drain interfaces 240, 250 by alternatingly exposing the substrate 200 to a first precursor and a second precursor. The method of fabricating the epitaxial region, as illustrated in FIGS. 6C, 6D and 6E, is similar to the methods of fabrication discussed in FIGS. 5C, 5D and 5E. Before exposing the substrate 200 to the first precursor, an optional surface pre-treatment can be performed on the substrate 200 to facilitate epitaxial growth and reduce surface defects. In one embodiment, the surface pre-treatment comprises a hydrogen bake treatment and/or etching step as previously discussed in FIG. 5C to clean the recessed source and drain interfaces 240, 250.

Beginning from FIG. 6C, the entire substrate 200 is exposed to the first precursor so at to deposit epitaxial films 511, 512 on the recessed source and drain interfaces 240, 250. The recessed source and drain interfaces 240, 250, including their {111} facets 241, 251 and {010} facets 242, 252, are monocrystalline surfaces that allow epitaxial growth of the epitaxial films 511, 512 thereon. On the other hand, the hard mask 410, the spacers 420, 440, and the gate dielectric 310 are non-crystalline surfaces, and thus the amorphous layer 513 is deposited thereon. The same first precursor and process conditions, as discussed in relation to FIG. 5C, are applicable here and will not be discussed.

Next, in FIG. 6D, the entire substrate 200 is similarly exposed to the second precursor to remove the amorphous layer 513 from the sidewalls 421, 441 and bottom surfaces 422, 442 of the spacers 420, 440. Furthermore, the second precursor also removes any amorphous layer 513 formed on the hard mask 410 and beneath the gate dielectric 310. The same second precursor and process conditions, as discussed in relation to FIG. 5D, are applicable here and will not be discussed.

FIGS. 6C and 6D illustrate one deposition-etch cycle of forming the epitaxial films 511, 512 over the recessed source and drain interfaces 240, 250 including their {111} facets 241, 251 and {010} facets 242, 252. The deposition-etch cycle is repeated until a desired number of epitaxial films are deposited. For illustration purposes, FIG. 6E shows epitaxial regions 531, 532 containing ten epitaxial films each. In an embodiment of the present invention, the epitaxial regions 531, 532 are deposited with a graded concentration of carbon or phosphorus as previously described in FIG. 5E. For example, the epitaxial regions 531, 532 (shown in FIG. 6E) are deposited with a graded carbon concentration of around 0.5 atomic % for the lowest epitaxial film and are gradually increased to a desired level of about 2 atomic % for the uppermost epitaxial film. Alternatively, the epitaxial regions 531, 532 are deposited with a graded phosphorus concentration level of around 8E19 cm$^{-3}$ for the lowest epitaxial film and are gradually increased to a desired level of around 2E21 cm$^{-3}$ for the uppermost epitaxial film. In one embodiment, the epitaxial regions 531, 532 are deposited with a combination of graded carbon concentration (0.5-2 atomic %) and graded phosphorus concentration (8E19-2E21 cm$^{-3}$).

Figure 6F:
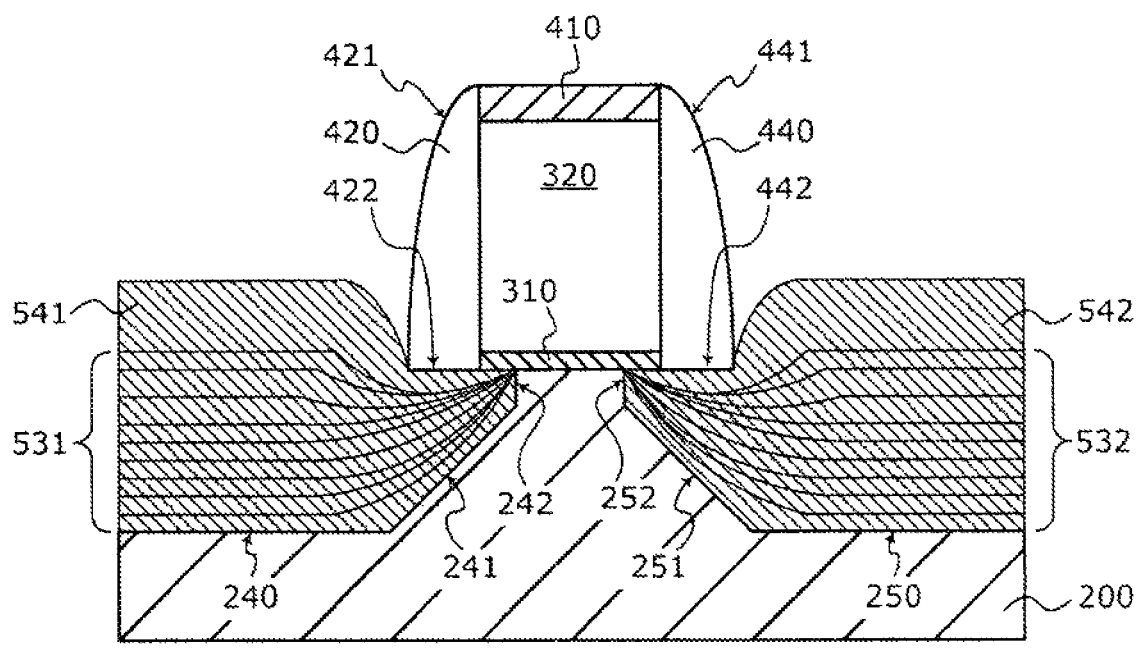

The removal of the amorphous layer 513 during each deposition-etch cycle similarly results in cavities 281,282 formed between the bottom surfaces 422, 442 of spacers 420, 440 and the top surfaces of the epitaxial regions 531, 532. The cavities 281, 282 are substantially backfilled by the cap layers 541, 542 selectively deposited over the epitaxial regions 531, 532 as shown in FIG. 6F.

In one embodiment, the cap layers 541, 542 are selectively deposited over the epitaxial regions 531, 532 in a single deposition process by exposing the substrate 200 to a third precursor. The same third precursor and process conditions, as discussed in relation to FIG. 5F, are applicable here. In the case where the epitaxial regions 531, 532 are crystalline films having silicon and carbon doped with phosphorus, the third precursor uses the same phosphorus dopant to form cap layers 541, 542. The crystalline surfaces of the epitaxial regions 531, 532 allow epitaxial growth of cap layers 541, 542 thereon, and as a result, the cap layers 541, 542 are epitaxial layers containing silicon doped with phosphorus. This completes the fabrication of the semiconductor device shown in FIG. 2.

Figure 7A:
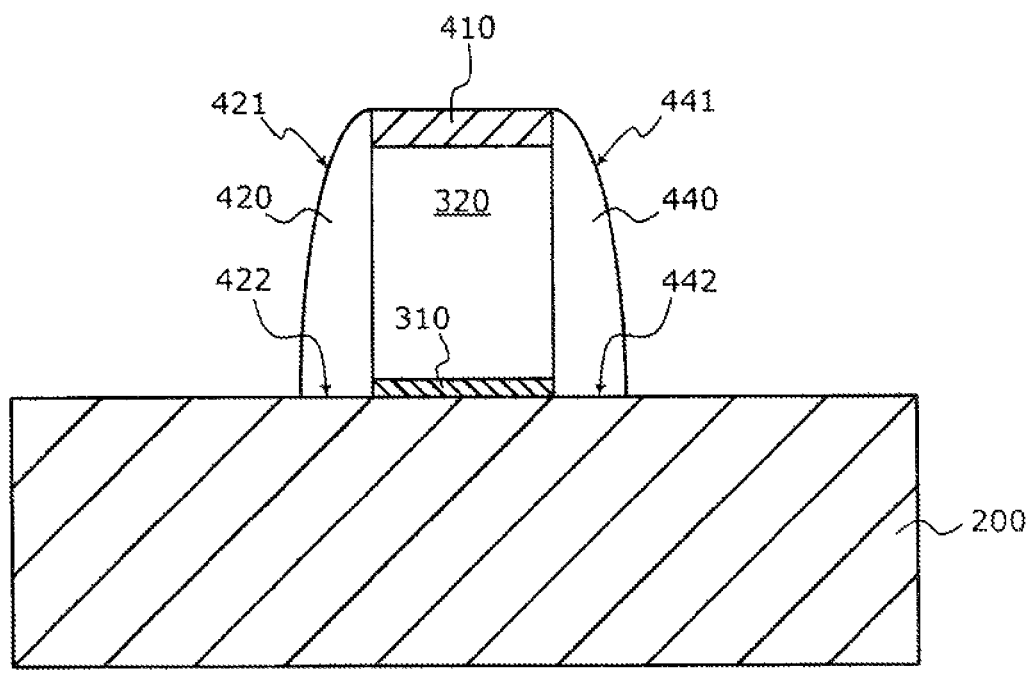
FIGS. 7A-7C are cross-sectional views that illustrate the method of fabricating the semiconductor device shown in FIG. 3.
Figure 7B:
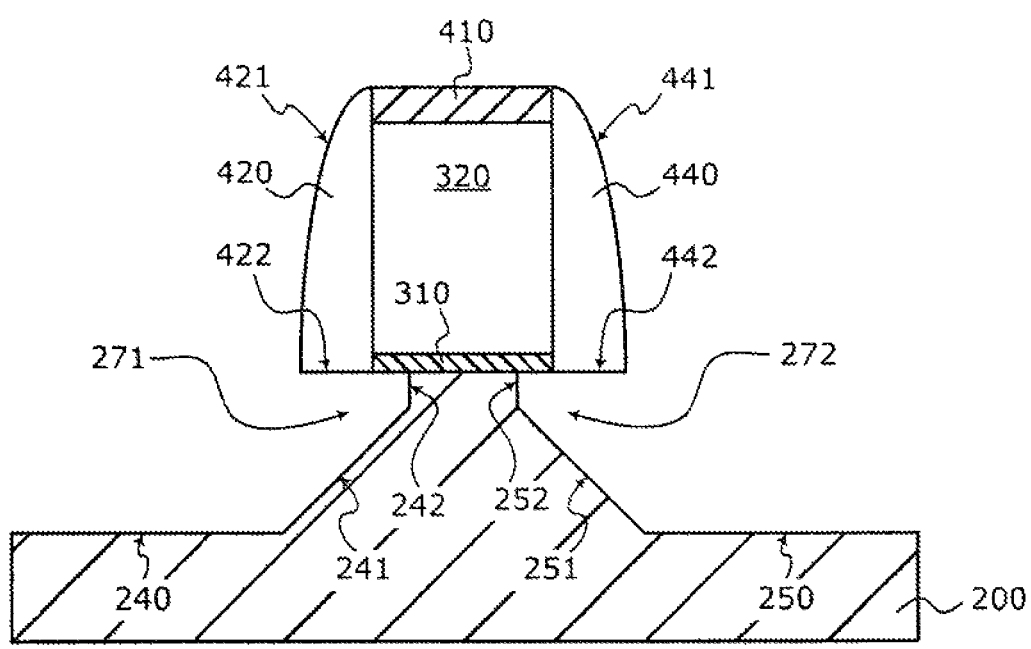
Figure 7C:
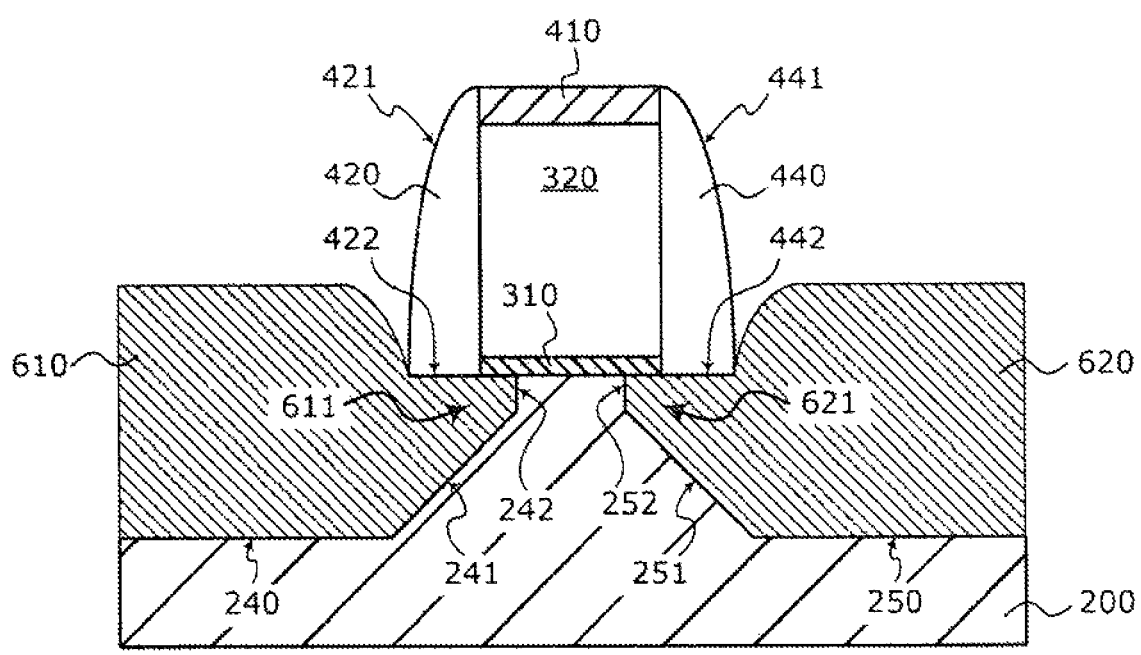

FIGS. 7A-7C illustrate a method of forming the semiconductor device as discussed in relation to FIG. 3. Beginning from FIG. 7A, the fabrication of the semiconductor device begins by providing the substrate 200. The semiconductor device shown in FIG. 7A is the same as FIG. 5A, and thus will not be discussed here.

Next, a source region and a drain region are formed on the substrate 200. In an embodiment of the present invention, fabrication of the source and drain regions begins by recessing portions of the substrate 200 using well known etching techniques, such as but not limited to dry etching or wet etching. In one embodiment, the wet etching used in FIG. 6B is similarly applied here to recess the substrate 200 so as to form a recessed source interface 240 and a recessed drain interface 250, as shown in FIG. 7B. The wet etch uses the same etchant chemistry as described in relation to FIG. 6B to form {111} facets 241, 251 in the {111} crystallographic plane of the {001} silicon substrate 200. In one embodiment, the wet etch further creates {010} facets 242, 252 in the channel region of the {001} silicon substrate 200.

Next, epitaxial layers 610, 620 are selectively deposited over the recessed source and drain interfaces 240, 250 as shown in FIG. 7C. In an embodiment of the present invention, the epitaxial layers 610, 620 are selectively deposited in a single deposition process by exposing the substrate 200 to a precursor comprising an etchant gas.

In one embodiment, the precursor comprises the silicon-containing compound and dopant similarly described in FIG. 5C. In one embodiment, the silicon-containing compound includes, but not limited to, silanes and halogenated silanes. Such silicon-containing compound includes silane ($SiH_4$), disilane ($Si_2H_6$), trisilane ($Si_3H_8$), dichlorosilane ($SiH_2Cl_2$), and penta-chloro silane. In an embodiment of the present invention, the dopant is a n-type dopant such as, but not limited to, phosphorus or arsenic. In one embodiment, the phosphorus dopant is introduced into the epitaxial layers using phosphine ($PH_3$) without any dilution in Hydrogen or an inert gas, such as $N_2$ or Ar. In another embodiment, the phosphine gas is mixed with hydrogen, for example as a mixture of 3% phosphine ($PH_3$) in hydrogen ($H_2$). In one embodiment, the etchant gas of the precursor includes, but is not limited to hydrogen ($H_2$) and anhydrous hydrochloric acid (HCl).

In one embodiment, a co-flown deposition technique is used to deliver the precursor, including the etchant gas to the substrate 200 at the same time. In one embodiment, the substrate 200 is exposed to the precursor at a temperature of about 550 to 800 degrees Celsius, at a pressure of about 10 torr to atmospheric pressure, and for a time duration of about 30 to 2000 seconds. In a specific embodiment, the substrate 200 is exposed to the first precursor at a temperature of 635 degrees Celsius, at a pressure of 600 torr, and for a time duration of 800 seconds.

In one embodiment, the epitaxial layers 610, 620 are grown to have a thickness of about 30 to 2000 Angstroms. In a specific embodiment, the epitaxial layers 610, 620 are grown to have a thickness of 750 Angstroms. In the case where a phosphorus dopant is used, the epitaxial layers 610, 620 comprise silicon doped with phosphorus.

In the case where the substrate 200 is made of monocrystalline silicon, the recessed source and drain interfaces 240, 250 including their {111} facets 241, 251 and {010} facets 242, 252 are monocrystalline surfaces that allow epitaxial growth of the epitaxial layers 610, 620 thereon. Since the hard mask 410 and spacers 420, 440 have non-crystalline surfaces, the etchant gas easily removes any silicon and phosphorus-containing compound that are weakly bonded on the hard mask 410 and spacers 420, 440 during deposition so that the epitaxial layers 610, 620 are deposited over the recessed source and drain interfaces 240, 250 and not deposited on the hard mask 410 or spacers 420, 440.

Portions of the epitaxial layer 610 deposited between the spacer 420 and {111}, {010} facets 241, 242 form the source epi-tip region 611. Similarly, portions of the epitaxial layer 620 deposited between the spacer 440 and {111}, {010} facets 251, 252 form the drain epi-tip region 621. By forming the source and drain epi-tip regions 611, 621 in relatively close proximity to the channel region, a larger hydrostatic stress is induced on the channel region, resulting in higher electron mobility. Furthermore, the phosphorus doped silicon epitaxial layers 610, 620 induces tensile stress on the channel region, thereby increasing electron mobility and improving the device performance. This completes the fabrication of the semiconductor device shown in FIG. 3.

In addition, an optional surface pre-treatment can be performed on the substrate 200 before exposing it to the precursor to facilitate epitaxial growth and reduce surface defects. For example, a similar hydrogen bake treatment described in relation to FIG. 5C is performed on the substrate 200 (in FIG. 7B) to clean the recessed source and drain interfaces 240, 250 including theirs {111} facets 241, 251 and {010} facets 242, 252.

Figure 8A:
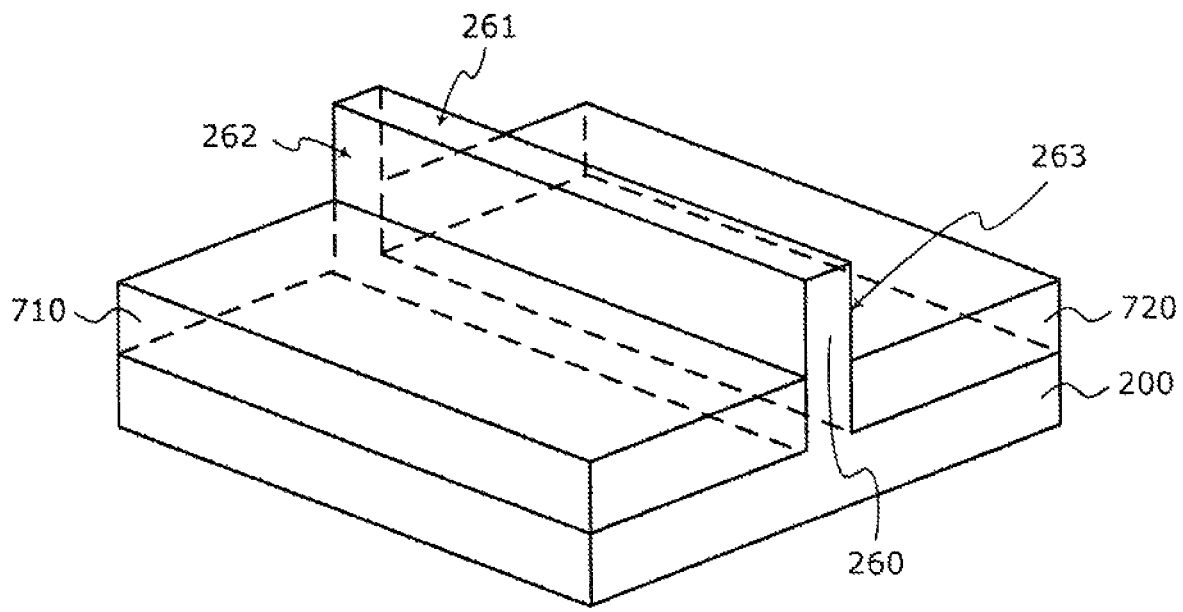
FIGS. 8A-8I are perspective views that illustrate the method of fabricating the semiconductor device shown in FIG. 4.

FIGS. 8A-8I illustrate a method of forming the tri-gate device as discussed in relation to FIG. 4. The fabrication of the tri-gate device begins by providing the substrate 200 as shown in FIG. 8A. The substrate 200 comprises a semiconductor body or fin 260 extending from the substrate 200 through the isolation regions 710, 720. In one embodiment, the isolation regions 710, 720 are shallow trench isolation (STI) regions formed by common techniques, such as etching the substrate 200 to form trenches, and then depositing oxide material onto the trenches to form the STI regions. The isolation regions 710, 720 are made from any well known insulative material, such as but not limited to silicon oxide (e.g., $SiO_2$).

In one embodiment, the fin 260 comprises a top surface 261 above the isolation regions 700. The fin 260 further includes a front surface 262 exposed above the isolation region 710, and a back surface 263 exposed above the isolation region 720. In one embodiment, the fin 260 is made from the same semiconductor materials as the substrate 200.

Figure 8B:
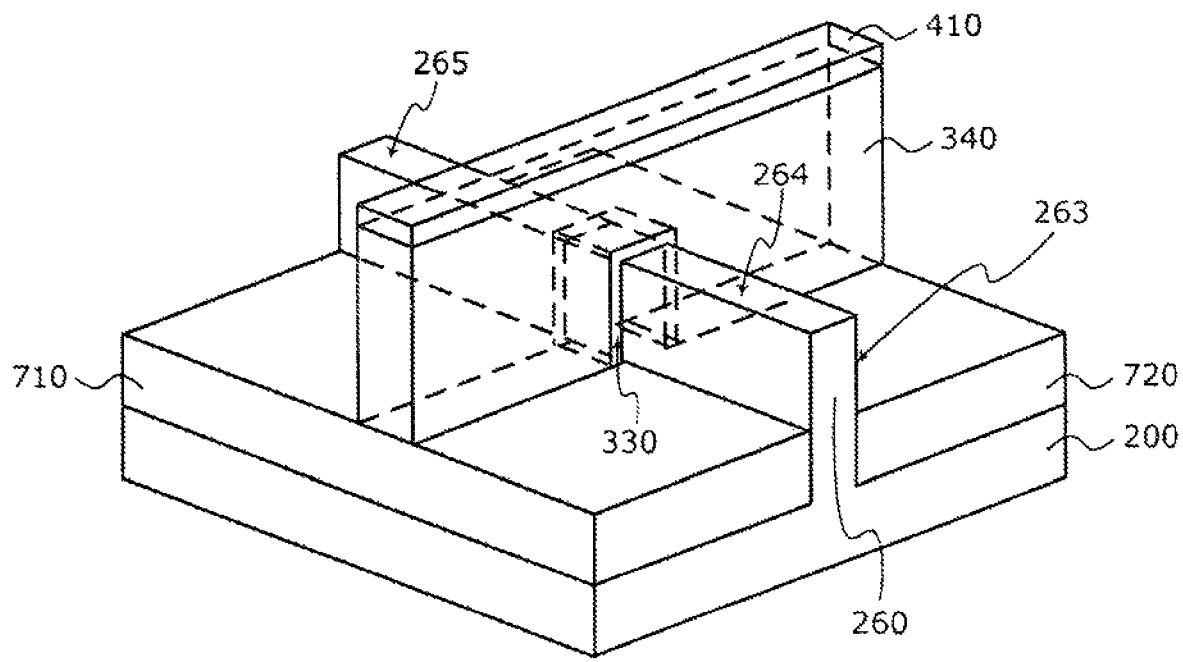

Next, in FIG. 8B, a gate dielectric 330 is formed over a portion of the top surface 261, the front surface 262 and the back surface 263. In one embodiment, the gate dielectric 330 is formed by any well known methods, such as but not limited to physical vapor deposition (PVD), chemical vapor deposition (CVD) or atomic layer deposition (ALD).

Then, a gate electrode 340 is formed over the gate dielectric 330, and exposing portions 264, 265 of the fin 260 at either sides of the gate electrode 340. In one embodiment, the gate electrode 340 is made of any well known materials, such as but not limited to polysilicon. The gate electrode 340 formed over the top surface 261, the front surface 262 and the back surface 263 creates three gates for the tri-gate device. The hard mask 410 is then formed on top of the gate electrode 320.

Figure 8C:
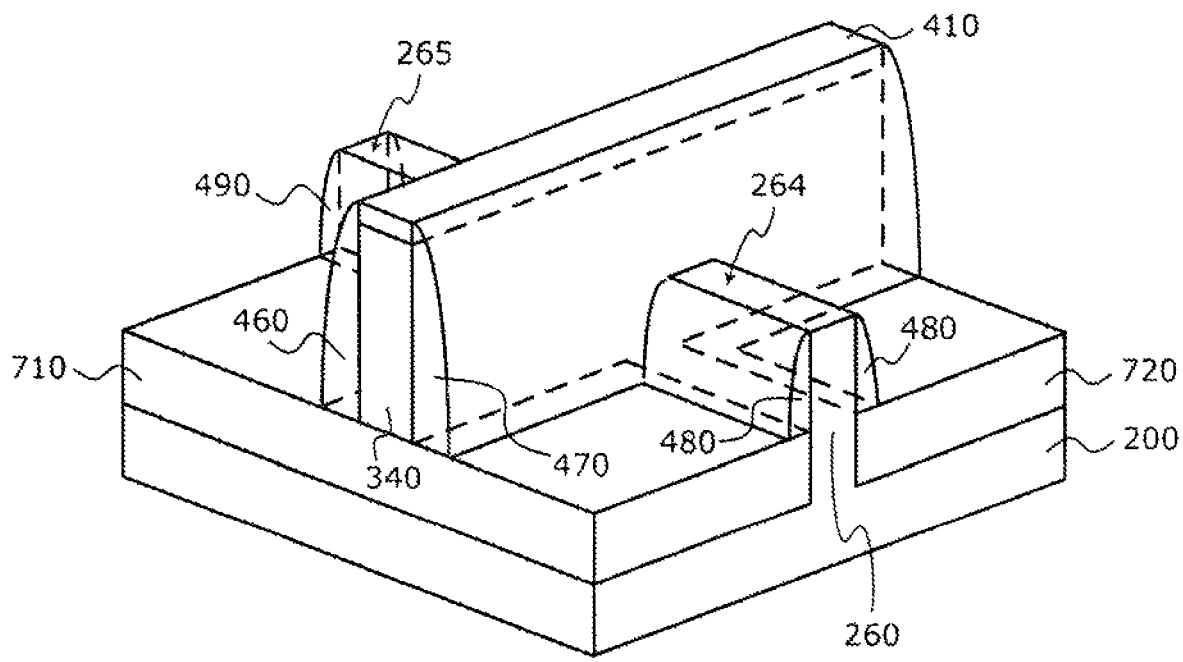
Figure 8D:
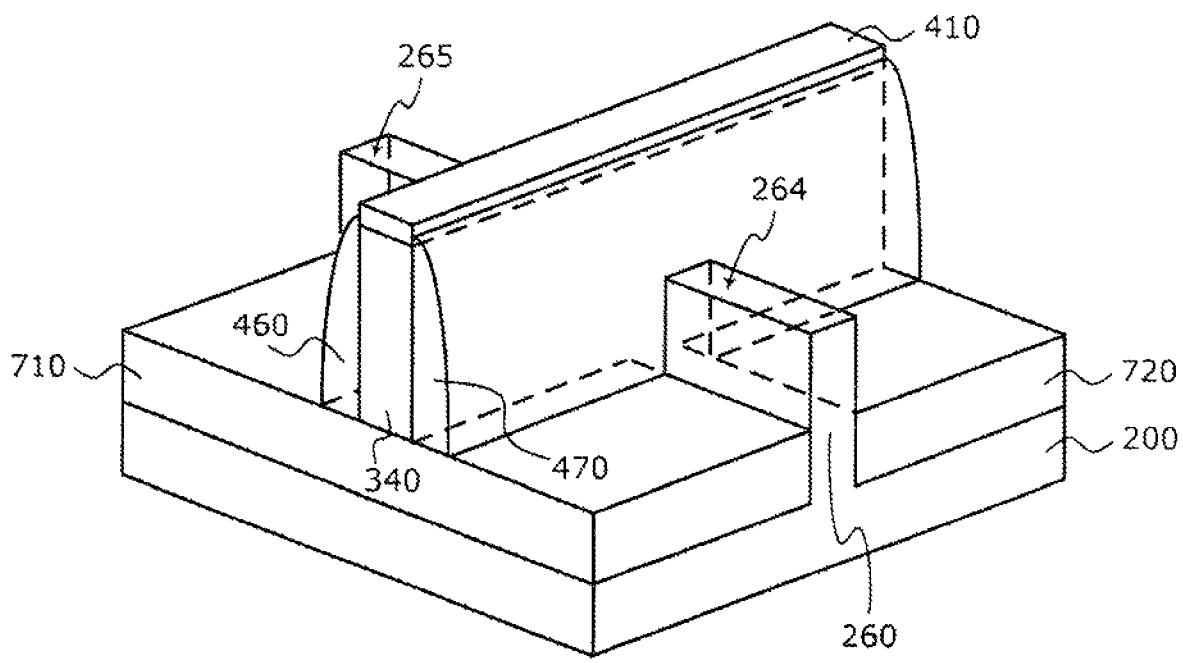

Next, gate spacers 460, 470 are deposited on opposite sidewalls of the gate electrode 340 as shown in FIG. 8C. In one embodiment, the spacers 460, 470 are formed by using well known techniques, such as depositing a layer of spacer material over the entire substrate 200 including the gate electrode 320, and then anisotropically etching the layer of spacer material to form the spacers 460, 470 on the sidewalls of gate electrode 340. At the same time, fin spacers 480, 490 are formed on the sidewalls of the exposed portions 264, 265 of the fin 260. In one embodiment, the gate spacers 460, 470 and fin spacers 480, 490 are made of a material such as but not limited to a silicon nitride, silicon dioxide or silicon oxynitride.

Next, a source region and a drain region are formed on the substrate 200. In an embodiment of the present invention, fabrication of the source and drain regions begins in FIG. 8D by removing the fin spacers 480, 490 from the sidewalls of the exposed portions 264, 265 of the fin 260. The fin spacers 480, 490 are removed by well known etching techniques, such as but not limited to dry etching or wet etching.

In one embodiment, an anisotropic wet-etch is used to completely remove the fin spacers 480, 490 from the exposed portions 264, 265 of the fin 260. At the same time, the anisotropic wet-etch also removes portions of the gate spacers 460, 470, thus exposing portions of the hard mask 410 sidewalls. Since the gate spacers 460, 470 have a larger height and thickness than the fin spacers 480, 490, the anisotropic wet-etch removes the fin spacers 480, 490 faster than the gate spacers 460, 470. The anisotropic wet-etch can be controlled to completely remove the fin spacers 480, 490 but leaving sufficient thickness of the gate spacers 460, 470 on the gate electrode 340 so that the gate electrode 340 sidewalls are not exposed.

Figure 8E:
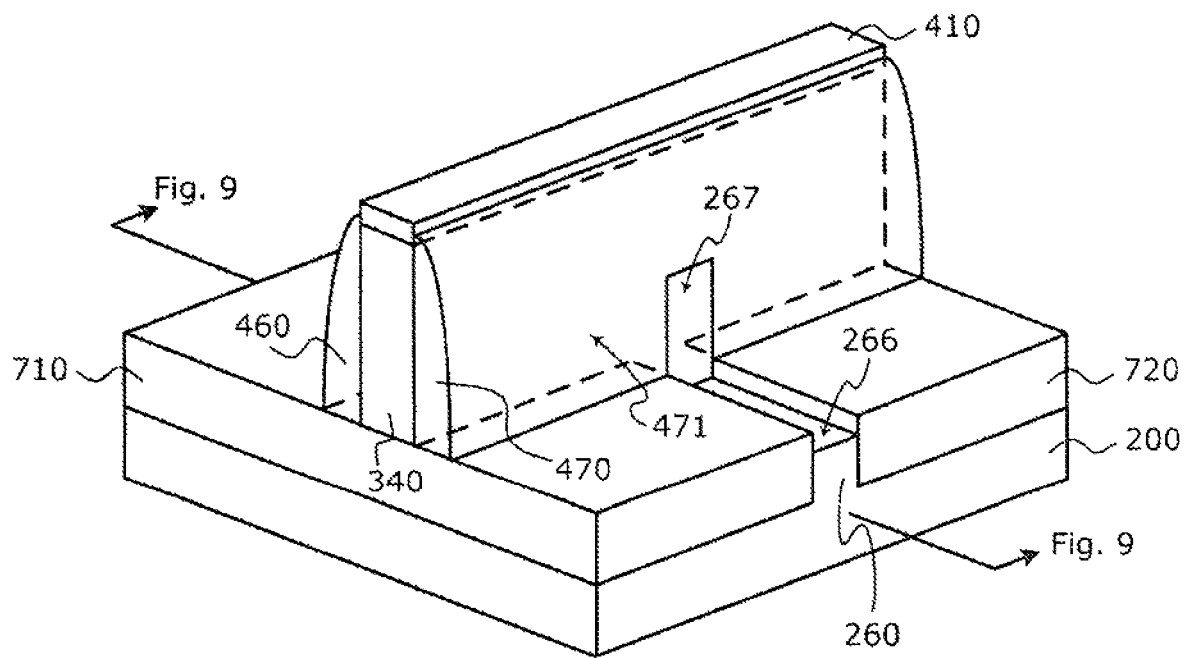
Figure 8E:
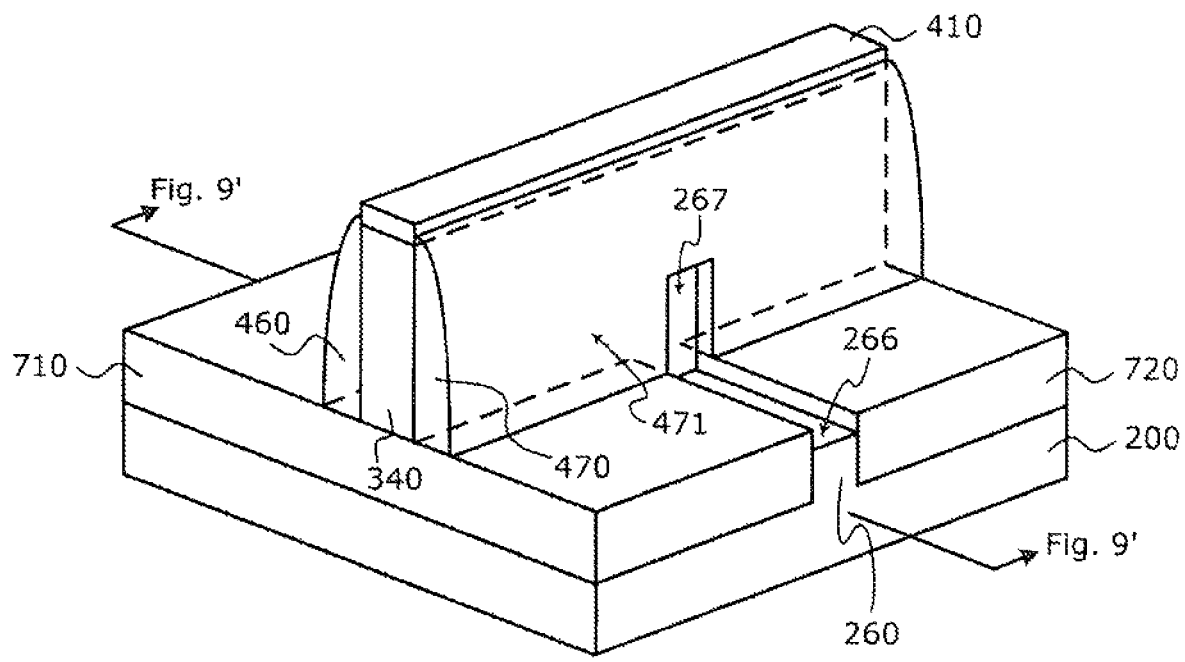

Next, an etching is performed on the substrate 200 to recess the exposed portions 264, 265 of the fin 260. In an embodiment of the present invention, the etching uses an etchant chemistry that is substantially selective to the fin 260 to recess the exposed portion 264 so as to form a recessed source interface 266 below the top surface of the isolation regions 710, 720, and to form a fin sidewall 267 as shown in FIG. 8E. On the other side of the gate electrode 340, the exposed portion 264 is recessed to form a recessed drain interface 268 and a fin sidewall 269. In one embodiment, the recessed source and drain interfaces 266, 268 are about 100 to 400 Angstroms below the top surface of the isolation regions 710, 720.

Figure 9:
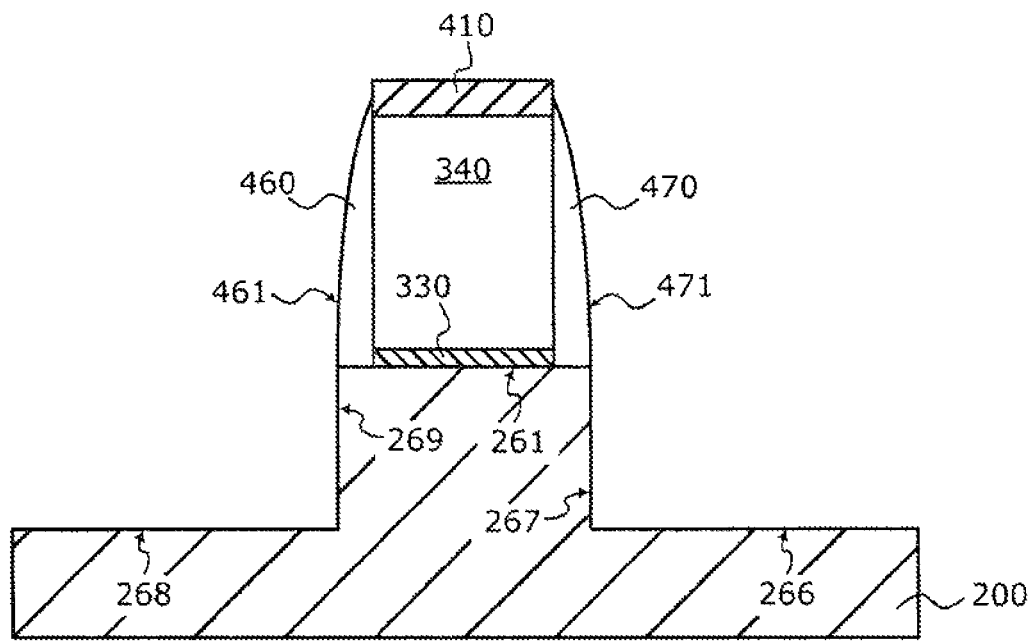
FIGS. 9-15 are cross-sectional views of the semiconductor device shown in FIGS. 8E-8I.
Figure 9:
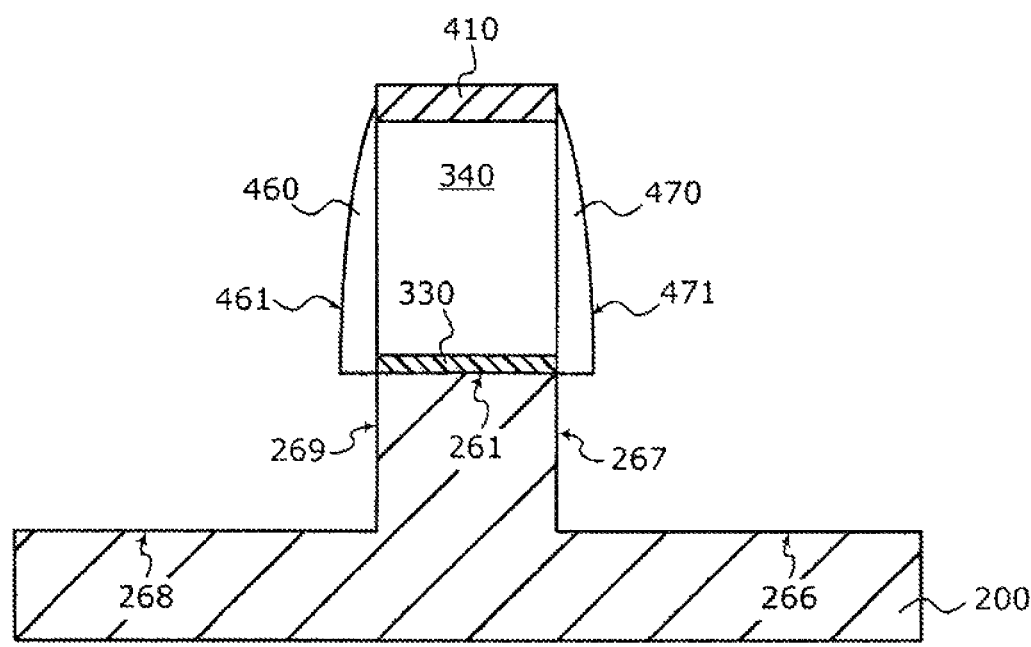

FIG. 9 illustrates a cross-sectional view of the tri-gate device showing the fin sidewall 267 extending from the top surface 261 to the recessed source interface 266, and the fin sidewall 269 extending from the top surface 261 to the recessed drain interface 268. In an embodiment of the present invention, the fin sidewalls 267, 269 are substantially coplanar or flushed with the gate spacers 460, 470 sidewalls 461, 471. In one embodiment, the fin sidewalls 267, 269 are {110} facets in the {110} crystallographic plane of the substrate 200, and the recessed source and drain interfaces 266, 268 are {100} facets in the {100} crystallographic plane of the substrate 200.

In an alternative embodiment, an isotropic etch is used to form fin sidewalls 267, 269 recessed within the gate spacers 460, 470. FIG. 8E' is a perspective view of the tri-gate device showing the fin sidewall 267 recessed within the gate spacer 470. FIG. 9' is a cross-sectional view showing both the fin sidewalls 267, 269 recessed beneath the gate spacer 460, 470. In one embodiment, the fin sidewalls 267, 269 are recessed until about 25 to 200 Angstroms from the gate spacer sidewalls 461, 471.

Continuing from FIG. 8E, an epitaxial region is then deposited over each of the recessed source and drain interfaces 266, 268 by alternatingly exposing the substrate 200 to a first precursor and a second precursor. The method of fabricating the epitaxial region, as illustrated in FIGS. 8F, 8G and 8H, is similar to the methods of fabrication discussed in FIGS. 5C, 5D and 5E.

Figure 8F:
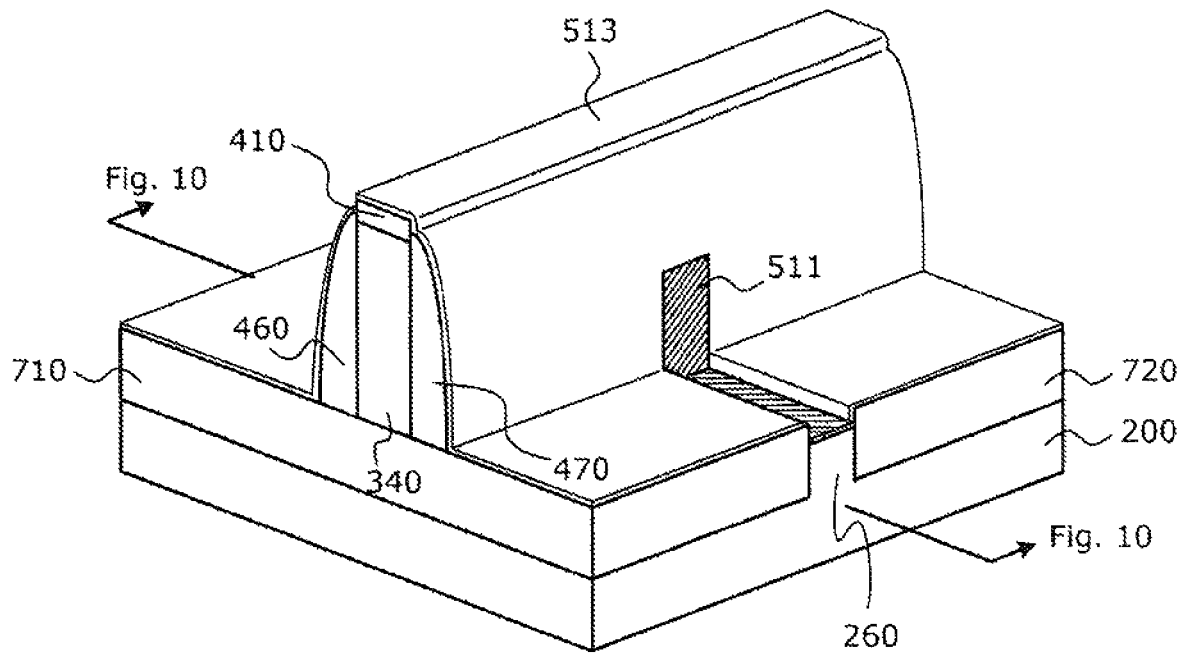
Figure 10:
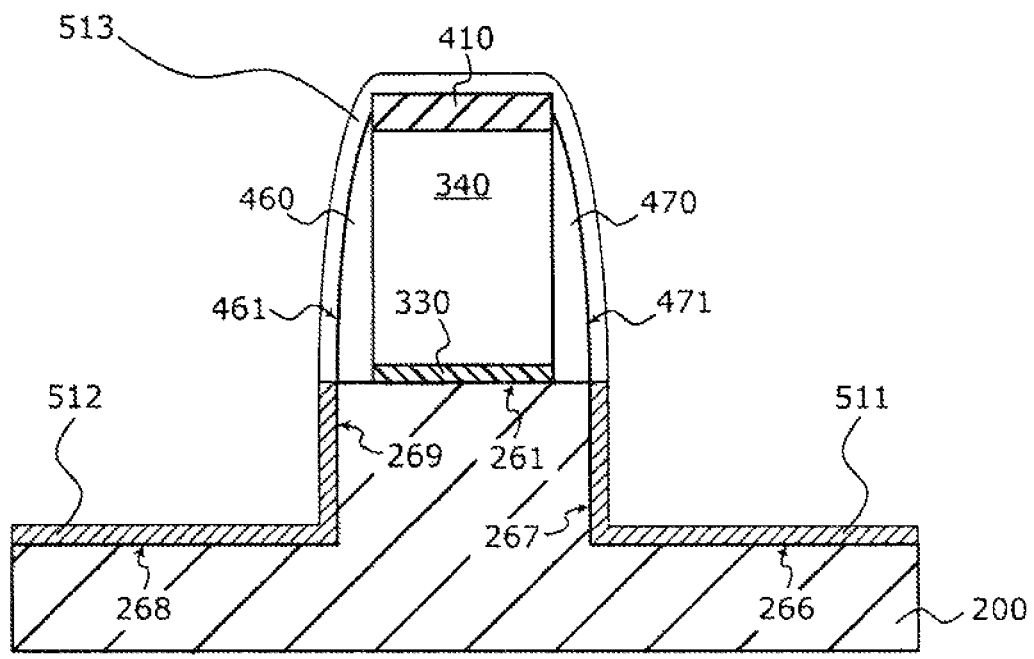

Beginning from FIG. 8F, the entire substrate 200 is exposed to the first precursor so at to deposit an epitaxial film 511 on the recessed source interface 266 and fin sidewall 267. At the same time, an epitaxial film 512 is deposited on the recessed drain interface 268 and fin sidewall 269 as shown in cross-sectional view of FIG. 10. The recessed source and drain interfaces 266, 268, and the fin sidewalls 267, 269, are monocrystalline surfaces that allow epitaxial growth of the epitaxial films 511, 512 thereon. On the other hand, the hard mask 410, the gate spacers 460, 470, and isolation regions 710, 720 are non-crystalline surfaces, and thus the amorphous layer 513 is formed thereon. The same first precursor and process conditions, as discussed in relation to FIG. 5C, are applicable here and will not be discussed.

Figure 8G:
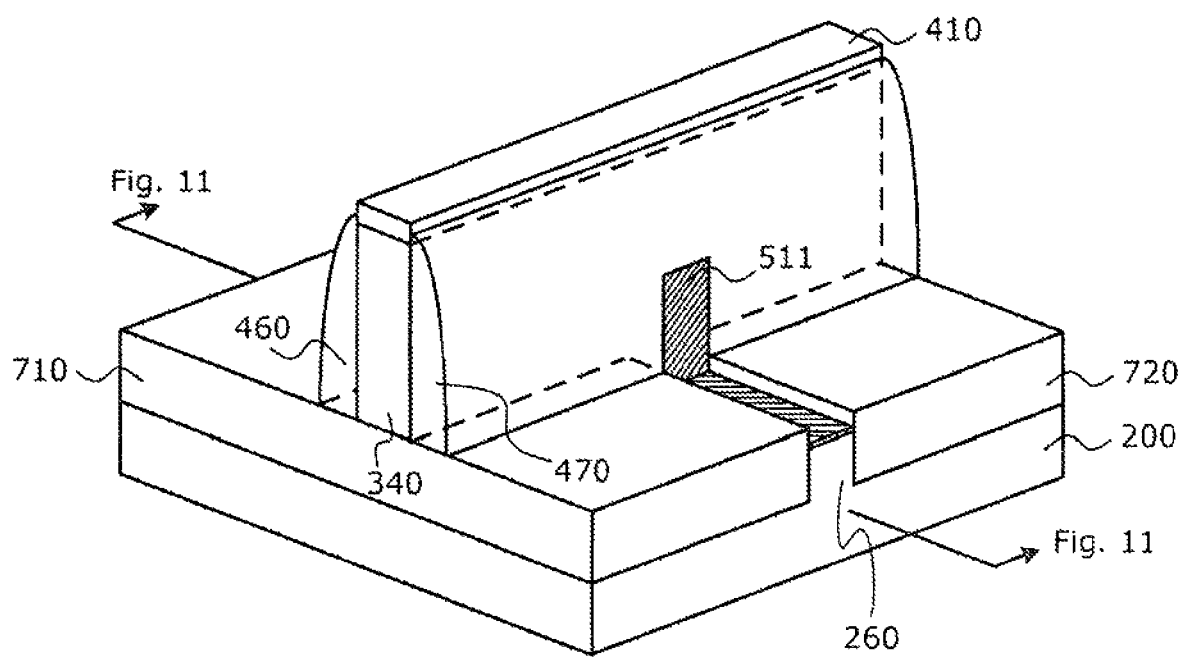
Figure 8H:
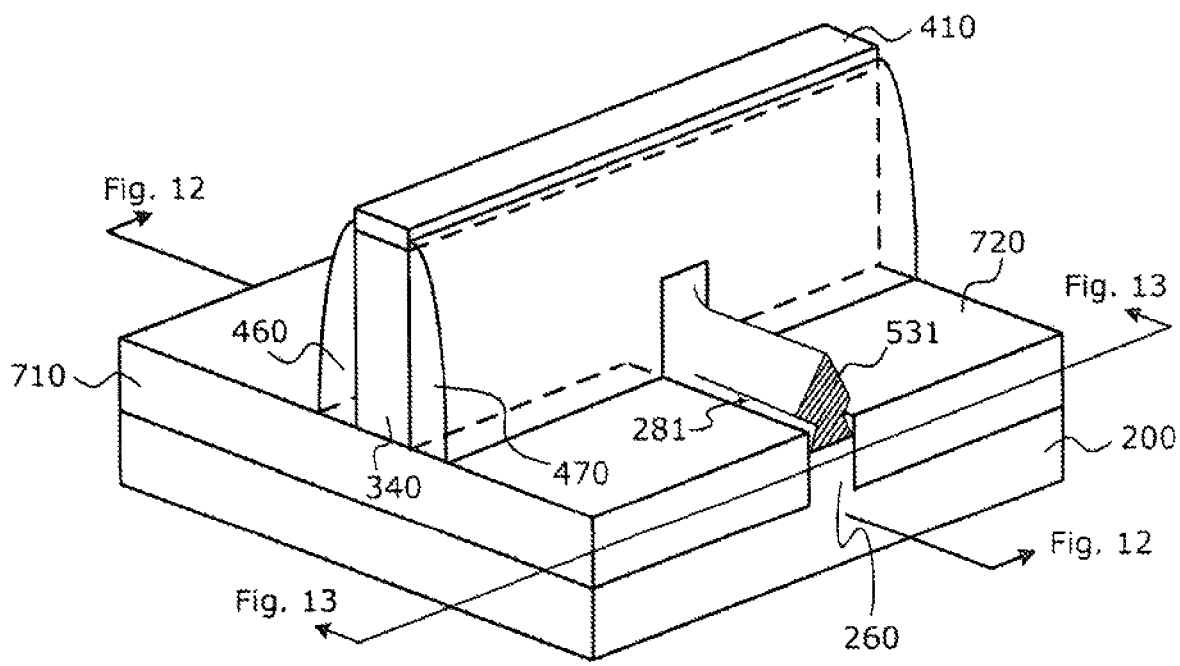
Figure 11:
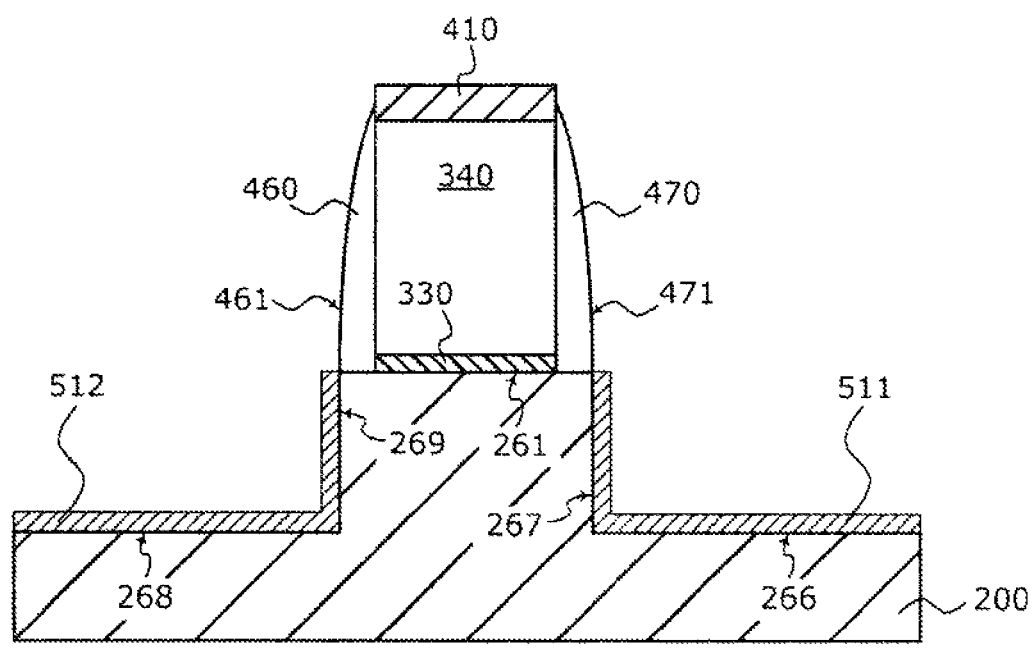

Next, in FIG. 8G, the entire substrate 200 is similarly exposed to the second precursor to remove the amorphous layer 513 from the gate spacers 460, 470, and isolation regions 710, 720. Furthermore, the second precursor also removes any amorphous layer 513 formed on the hard mask 410. FIG. 11 shows a cross-sectional view of the tri-gate device after the amorphous layer 513 has been removed. The same second precursor and process conditions, as discussed in relation to FIG. 5D, are applicable here and will not be discussed.

Figure 12:
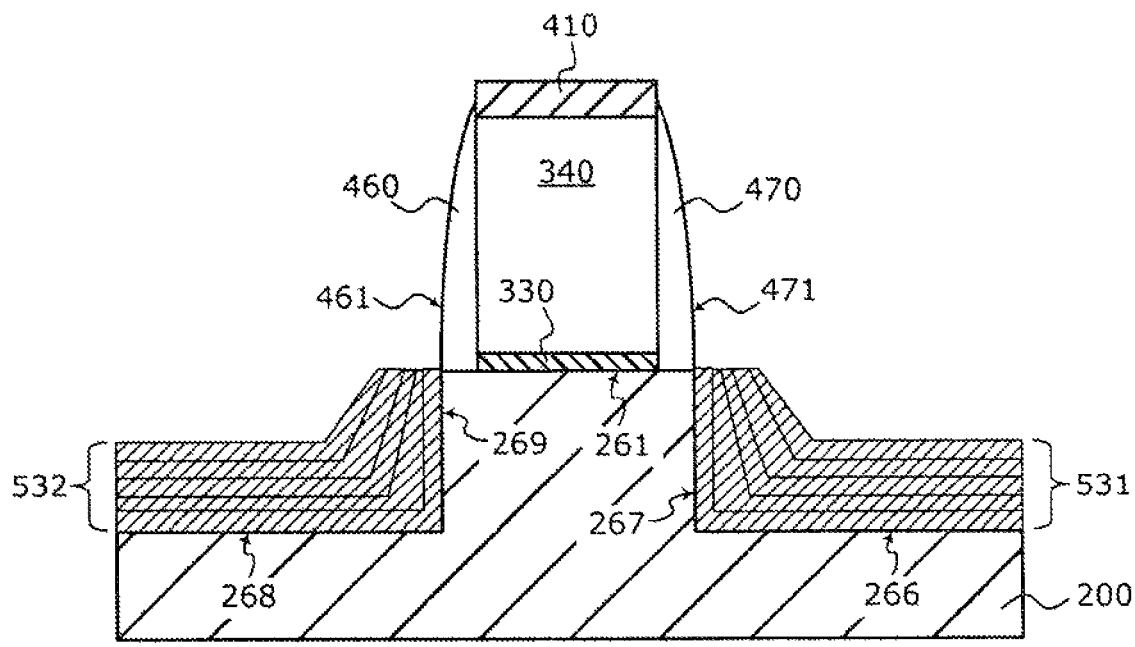

FIGS. 8F-8G and FIGS. 10-11 illustrate one deposition-etch cycle of forming the epitaxial films 511, 512 over the recessed source and drain interfaces 266, 268 and the fin sidewalls 267, 269. The deposition-etch cycle is repeated until a desired number of epitaxial films are deposited. In one embodiment, the final epitaxial regions 531, 532 comprise five epitaxial films as shown in FIG. 12. In an embodiment of the present invention, the epitaxial regions 531, 532 are deposited with a graded concentration of carbon or phosphorus as previously described in FIG. 5E. For example, the epitaxial regions 531, 532 (shown in FIG. 12) are deposited with a graded carbon concentration of around 0.5 atomic % for the lowest epitaxial film and are gradually increased to a desired level of about 2 atomic % for the uppermost epitaxial film. Alternatively, the epitaxial regions 531, 532 are deposited with a graded phosphorus concentration level of around $8E19$ $cm^{-3}$ for the lowest epitaxial film and are gradually increased to a desired level of around $2E21$ $cm^{-3}$ for the uppermost epitaxial film. In one embodiment, the epitaxial regions 531, 532 are deposited with a combination of graded carbon concentration (0.5-2 atomic %) and graded phosphorus concentration ($8E19$-$2E21$ $cm^{-3}$).

In the alternative embodiment where the fin sidewalls 267, 269 are recessed within the gate spacers 460, 470, the epitaxial regions 531, 531 are formed in closer proximity to the channel region of the tri-gate device, thus inducing a higher amount of stress on the channel region.

Figure 8I:
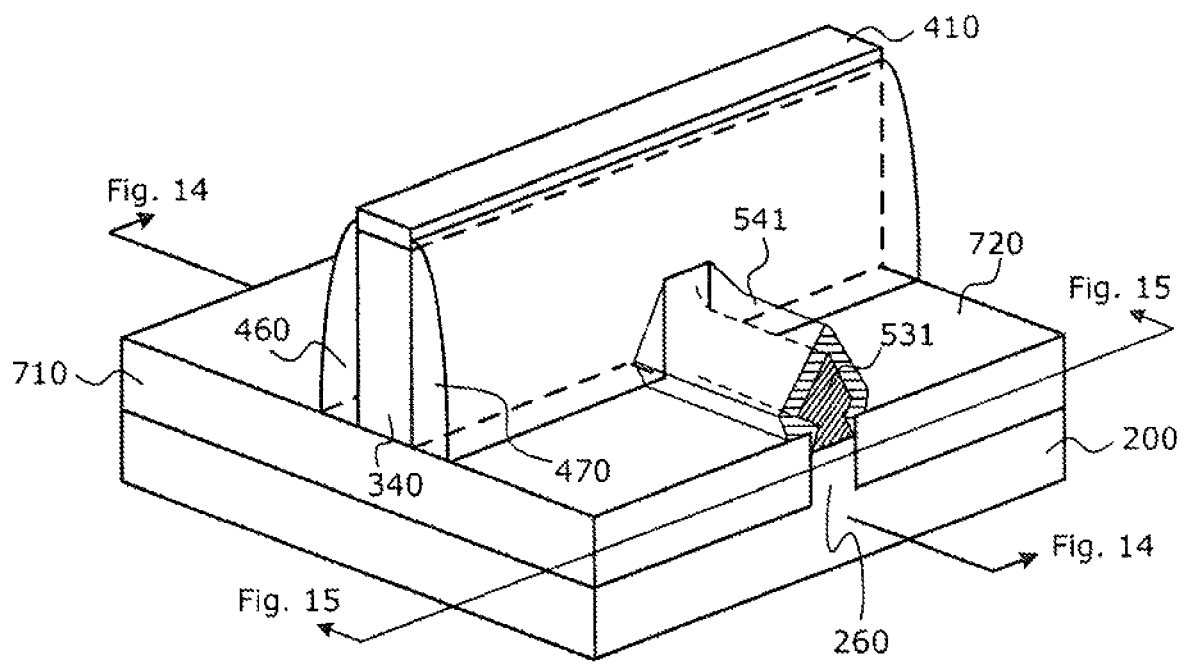
Figure 13:
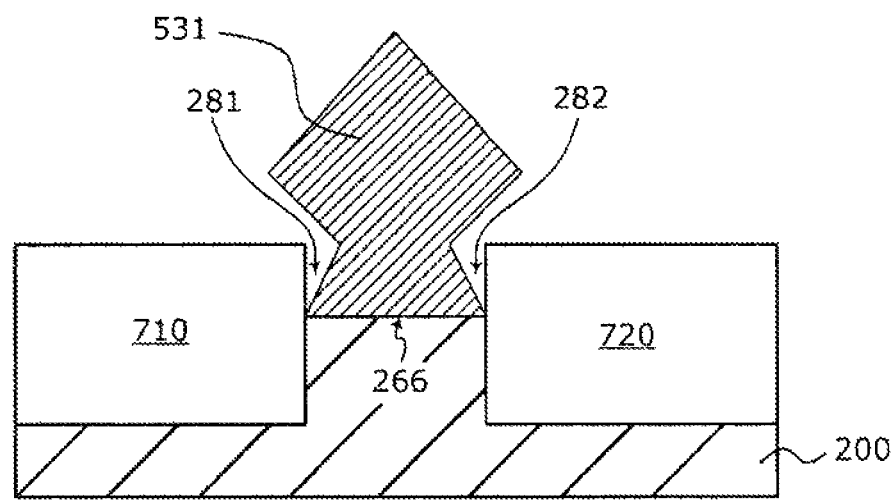
Figure 14:
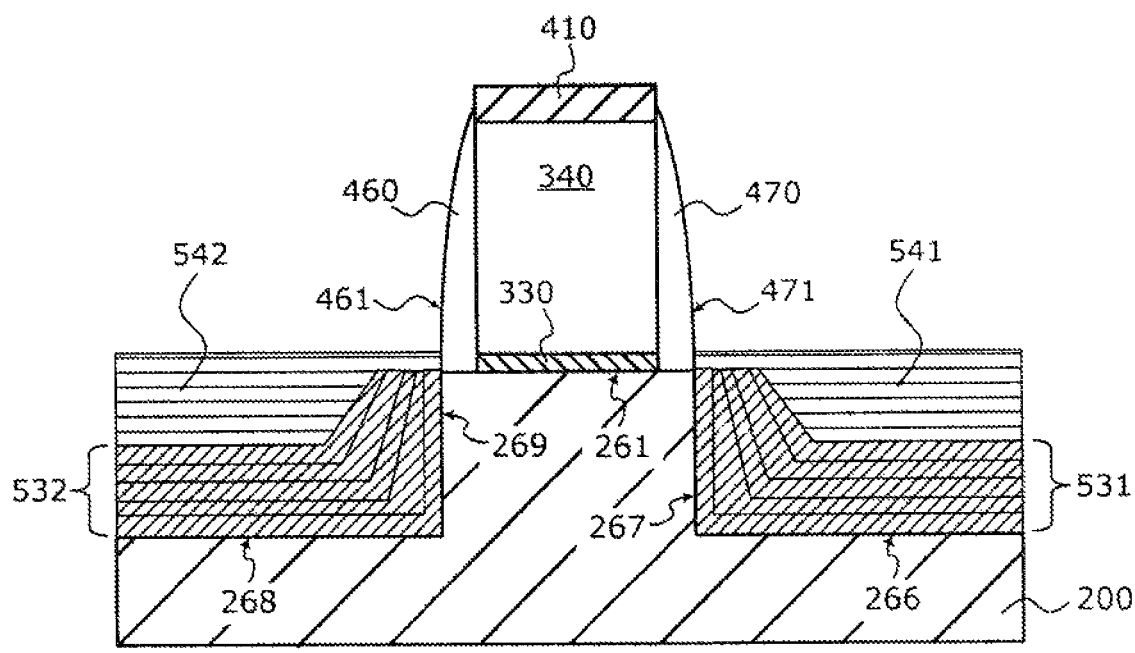
Figure 15:
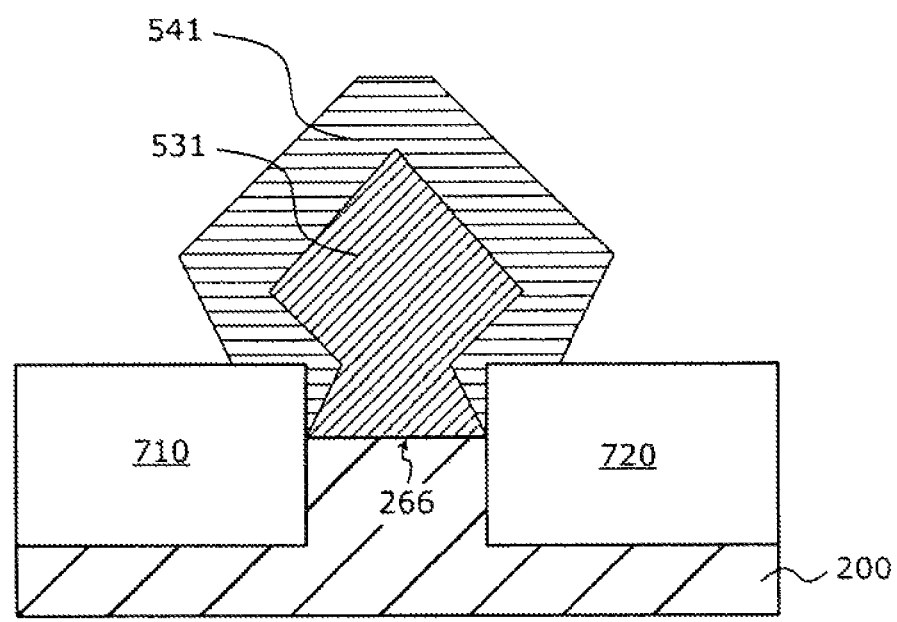

The removal of the amorphous layer 513 during each deposition-etch cycle similarly results in voids or cavities 281,282 formed between the epitaxial regions 531, 532 and the isolation regions 710, 720 as shown in FIGS. 8H and 13. The cavities 281, 282 are substantially backfilled by the cap layers 541, 542 selectively deposited over the epitaxial regions 531, 532 as shown in FIGS. 8I, 14 and 15.

In one embodiment, the cap layers 541, 542 are selectively deposited over the epitaxial regions 531, 532 in a single deposition process by exposing the substrate 200 to a third precursor. The same third precursor and process conditions, as discussed in relation to FIG. 5F, are applicable here. In the case where the epitaxial regions 531, 532 are crystalline films having silicon and carbon doped with phosphorus, the third precursor uses the same phosphorus dopant to form cap layers 541, 542. The crystalline surfaces of the epitaxial regions 531, 532 allow epitaxial growth of cap layers 541, 542 thereon, and as a result, the cap layers 541, 542 are epitaxial layers containing silicon doped with phosphorus. The phosphorus doped silicon cap layers 541, 542 provide an advantage of inducing tensile stress on the channel region of the semiconductor fin 260, which increases the electron mobility and improves the device performance. This completes the fabrication of the semiconductor device shown in FIG. 4.

Several embodiments of the invention have thus been described. However, those ordinarily skilled in the art will recognize that the invention is not limited to the embodiments described, but can be practiced with modification and alteration within the spirit and scope of the appended claims that follow.

We claim:
1. A semiconductor structure, comprising:
a gate electrode over a single crystalline silicon substrate, the gate electrode defining a channel region in the single crystalline silicon substrate;
a gate dielectric between the gate electrode and the channel region, the gate dielectric having a bottom surface;
an epitaxial semiconductor source region laterally adjacent a first end of the channel region at a first side of the gate electrode and extending above an uppermost surface of the channel region, the epitaxial semiconductor source region in contact with a first portion of the bottom surface of the gate dielectric, and the epitaxial semiconductor source region comprising a first inflection point at a lowermost horizontal surface of the epitaxial semiconductor source region and a second inflection point above the first inflection point, wherein a single facet is between the first and second inflection points of the epitaxial semiconductor source region, wherein the first inflection point of the epitaxial semiconductor source region is not vertically beneath the gate electrode, and wherein the second inflection point of the epitaxial semiconductor source region is vertically beneath the gate electrode;
an epitaxial semiconductor drain region laterally adjacent a second end of the channel region at a second side of the gate electrode opposite the first side of the gate electrode and extending above an uppermost surface of the channel region, the epitaxial semiconductor drain region in contact with a second portion of the bottom surface of the gate dielectric, and the epitaxial semiconductor drain region comprising a first inflection point at a lowermost horizontal surface of the epitaxial semiconductor drain region and a second inflection point above the first inflection point, wherein a single facet is between the first and second inflection points of the epitaxial semiconductor drain region, wherein the first inflection point of the epitaxial semiconductor drain region is not vertically beneath the gate electrode, and wherein the second inflection point of the epitaxial semiconductor drain region is vertically beneath the gate electrode;
a first dielectric spacer adjacent the first side of the gate electrode and over a portion of the epitaxial semiconductor source region, wherein the first inflection point of the epitaxial semiconductor source region is not vertically beneath the first dielectric spacer; and
a second dielectric spacer adjacent the second side of the gate electrode and over a portion of the epitaxial semiconductor drain region, wherein the first inflection point of the epitaxial semiconductor drain region is not vertically beneath the second dielectric spacer.

2. The semiconductor structure of claim 1, wherein the gate dielectric comprises a layer of hafnium oxide.

3. The semiconductor structure of claim 1, wherein the gate electrode is a metal gate electrode.

4. The semiconductor structure of claim 1, wherein the first dielectric spacer and the second dielectric spacer comprise silicon nitride.

5. A method of fabricating a semiconductor structure, the method comprising:
   forming a gate electrode over a single crystalline silicon substrate, the gate electrode defining a channel region in the single crystalline silicon substrate;
   forming a gate dielectric between the gate electrode and the channel region, the gate dielectric having a bottom surface;
   forming an epitaxial semiconductor source region laterally adjacent a first end of the channel region at a first side of the gate electrode and extending above an uppermost surface of the channel region, the epitaxial semiconductor source region in contact with a first portion of the bottom surface of the gate dielectric, and the epitaxial semiconductor source region comprising a first inflection point at a lowermost horizontal surface of the epitaxial semiconductor source region and a second inflection point above the first inflection point, wherein a single facet is between the first and second inflection points of the epitaxial semiconductor source region, wherein the first inflection point of the epitaxial semiconductor source region is not vertically beneath the gate electrode, and wherein the second inflection point of the epitaxial semiconductor source region is vertically beneath the gate electrode;
   forming an epitaxial semiconductor drain region laterally adjacent a second end of the channel region at a second side of the gate electrode opposite the first side of the gate electrode and extending above an uppermost surface of the channel region, the epitaxial semiconductor drain region in contact with a second portion of the bottom surface of the gate dielectric, and the epitaxial semiconductor drain region comprising a first inflection point at a lowermost horizontal surface of the epitaxial semiconductor drain region and a second inflection point above the first inflection point, wherein a single facet is between the first and second inflection points of the epitaxial semiconductor drain region, wherein the first inflection point of the epitaxial semiconductor drain region is not vertically beneath the gate electrode, and wherein the second inflection point of the epitaxial semiconductor drain region is vertically beneath the gate electrode;
   forming a first dielectric spacer adjacent the first side of the gate electrode and over a portion of the epitaxial semiconductor source region, wherein the first inflection point of the epitaxial semiconductor source region is not vertically beneath the first dielectric spacer; and
   forming a second dielectric spacer adjacent the second side of the gate electrode and over a portion of the epitaxial semiconductor drain region, wherein the first inflection point of the epitaxial semiconductor drain region is not vertically beneath the second dielectric spacer.

6. The method of claim 5, wherein the gate dielectric comprises a layer of hafnium oxide.

7. The method of claim 5, wherein the gate electrode is a metal gate electrode.

8. The method of claim 5, wherein the first dielectric spacer and the second dielectric spacer comprise silicon nitride.

* * * * *